United States Patent
He et al.

(10) Patent No.: US 7,525,396 B2
(45) Date of Patent: Apr. 28, 2009

(54) SYSTEM, MICROWAVE SWITCH AND METHOD FOR HOT STANDBY OF RADIO FREQUENCY POWER AMPLIFIER

(75) Inventors: Pinghua He, Guangdong (CN); Wenxin Yuan, Guangdong (CN)

(73) Assignee: Huawei Technologies Co., Ltd., Shenzhen, Guangdong (CN)

( * ) Notice: Subject to any disclaimer, the term of this patent is extended or adjusted under 35 U.S.C. 154(b) by 0 days.

(21) Appl. No.: 11/750,435

(22) Filed: May 18, 2007

(65) Prior Publication Data
US 2008/0136554 A1 Jun. 12, 2008

Related U.S. Application Data

(63) Continuation of application No. PCT/CN2005/001969, filed on Nov. 21, 2005.

(30) Foreign Application Priority Data
Nov. 19, 2004 (CN) ........................ 2004 1 0052278
Dec. 17, 2004 (CN) ........................ 2004 1 0077687

(51) Int. Cl.
*H01P 1/10* (2006.01)
*H01P 5/12* (2006.01)
*H03F 3/68* (2006.01)

(52) U.S. Cl. .................... 333/101; 333/136; 330/124 D

(58) Field of Classification Search ................ 333/101, 333/103, 105, 262, 128, 136; 330/124 D
See application file for complete search history.

(56) References Cited

U.S. PATENT DOCUMENTS 6,208,203 B1 * 3/2001 Jung et al. .................... 330/51

7,061,315 B2    6/2006 Merrill
7,084,717 B2 *  8/2006 Okazaki et al. ............. 333/118
2007/0139104 A1 * 6/2007 Yuan ....................... 330/124 D

FOREIGN PATENT DOCUMENTS

CN    1254458 A    5/2000
JP    4054736      2/1992

OTHER PUBLICATIONS

International Search Report mailed Feb. 6, 2006; PCT/CN2005/001969.

* cited by examiner

*Primary Examiner*—Dean O Takaoka
(74) *Attorney, Agent, or Firm*—Ladas & Parry LLP

(57) ABSTRACT

Systems and methods for hot standby of radio frequency (RF) power amplifier are disclosed, an auxiliary RF power amplifier is added and SPDT microwave switches are adopted at the input and output sides of primary RF power amplifiers to control whether to make the auxiliary RF power amplifier function. When a primary RF power amplifier fails, the auxiliary power amplifier can immediately take over the functions of the failed primary RF power amplifier without cutting off the power or stopping the operation of the whole system. SPDT microwave switches with multiple transmission lines and switch devices connected based on certain topologies are disclosed. The SPDT microwave switches have the functions of signal switching and power dividing and combining, simple circuit topology, excellent impedance matching characteristics or no reflected signals at ports, therefore the switches are highly practical and can be adopted in RF power amplifier hot standby systems.

25 Claims, 7 Drawing Sheets

SYSTEM, MICROWAVE SWITCH AND METHOD FOR HOT STANDBY OF RADIO FREQUENCY POWER AMPLIFIER

FIELD OF THE TECHNOLOGY

The present invention relates to radio technology, and particularly, to systems, microwave switches, and methods for hot standby of radio frequency (RF) power amplifier.

BACKGROUND OF THE INVENTION

RF power amplifiers are important components widely adopted in radio access system and microwave system for amplifying signals. In a CDMA or WCDMA radio access multi-carrier system, when a power amplifier in a sector fails, cell phone users in the sector will be cut off, which imposes negative influence on the quality of service of mobile communication operators. Therefore, CDMA radio access multi-carrier systems have strict requirements concerning the stability and reliability of power amplifiers. However, power amplifiers work with strong current, high voltage and tough thermal environment, which make them vulnerable to failures. Hence it is necessary to develop a hot standby technology for power amplifiers in order to improve their stability.

Taking a 3-sector application as an example, as shown in FIG. 1, a sector of conventional technology has at least one power amplifier, which only amplifies input signals of its home sector and does not deal with signals of other sectors. Power amplifiers of different sectors are isolated from each other. The input signals from IN1, after being amplified by a power amplifier PA1, reach antennas S1 of a sector. The input signals from IN2 are amplified by a power amplifier PA2 and reach antennas S2. Similarly, the input signals from IN3 are amplified by a power amplifier PA3 and reach antennas S3. If PA1 is damaged, there is no signal output from its home sector and all mobile user terminals in the sector are unable to access the system, which will hurt the reputation of both the mobile operator and the equipment manufacturer. Such conventional solution without hot standby and power share system requires high reliability of power amplifiers.

There is a hot standby and power share network for power amplifiers in the prior art, as shown in FIG. 2. The solution (3 dB hybrid couplers) adopts hybrid matrix (taking 4×4 matrixes as an example), which consists of front hybrid matrix, power amplifier matrix, and rear hybrid matrix. The difference between such a solution and the conventional solution, which does not adopt hot standby and power share technology, is that each of the power amplifiers in the power amplifier matrix amplifies the input signals of all three sectors. The front hybrid matrix works as a power divider and the rear hybrid matrix is a power combiner. The work process of the solution is explained as follows. The input signal IN1 is first divided by the front hybrid matrix into four signals, which reach the input ends of the four power amplifiers respectively. The four signals have the same amplitude and keep a 90 degree phase difference to the signals of neighboring ports. After being amplified, the four signals are inputted into the rear hybrid matrix, which is structurally the same as the front hybrid matrix and are combined into one signal to be sent to Antenna S1 of Sector 1. Because there is a 90 degree phase difference to the signals of neighboring ports, the signal from IN1, after being divided, amplified, and combined, will be exported at Antenna S1 and not exported at Antennas S2 and S3 or applied to matching resistance in an ideal application. Similarly, the input signals from IN2 will only be exported at Antenna S2, and those from IN3 will only be exported at Antenna S3 without being sent to other ports.

Compared with the conventional solution which does not adopt hot standby and power share technology, the solution described in the fore-going paragraph can, theoretically and without regard to the signal losses in the dividing and combining process, increase the power of the signals exported to the antennas to 1.23 dB in every sector.

In such a solution, when a power amplifier fails, the remaining two power amplifiers still work normally and the input signals from IN1 can still reach Antennas S1 of Sector 1 after being amplified by the system, and the input signals from IN2 and IN3 also reach S2 and S3. The cell phone users in all three sectors can access the system, the failure of the conventional solution in which the cell phone users in a sector cannot access the system will not happen to this solution, and the hot standby and power share for power amplifiers is thus achieved.

However, in this solution it is required to divide a signal into four signals with exactly the same amplitude and a 90 degree phase difference in the front hybrid matrix, so that the signals from other sectors can be cancelled based only on the amplitude difference and phase difference between signals, which imposes high requirement on the signal amplitude and phase. The factors described below may cause incomplete cancellation of signals, which leads to cross-talk between sectors and deteriorates the sector isolation. This is a fatal defect, which prevents its widespread use. The following are the factors that affect the amplitude and phase difference between signals in the dividing and combining process and eventually cause incomplete cancellation of signals:

1. The coupling of the 3 dB hybrid couplers being unable to achieve the ideal of 3 dB due to flaws in their design and manufacturing process.

2. The 3 dB hybrid couplers, given any deviation from the center frequency, being theoretically unable to meet the requirements on signal amplitude and on signal phase difference at the same time, even when they are ideal 3 dB hybrid couplers which meet the requirements on phase and coupling degree only at the center frequency.

3. Additional phase difference produced by inconsistent electrical lengths of the transmission lines A1, A2, A3 and A4 in the front hybrid matrix.

4. Additional phase difference produced by inconsistent electrical lengths of the transmission lines B1, B2, B3 and B4 between the front hybrid matrix and the power amplifiers.

5. Additional phase difference produced by inconsistent electrical lengths of the transmission lines C1, C2, C3 and C4 between the rear hybrid matrix and the power amplifiers.

6. Additional phase difference produced by inconsistent electrical lengths of the transmission lines D1, D2, D3 and D4 in the rear hybrid matrix.

7. Inconsistent characteristics of power amplifiers PA1, PA2, PA3 and PA4; characteristics especially the gain and phase difference among the power amplifiers are expected to meet extremely strict requirements: the gain difference should be less than 0.5 dB and the phase difference should be less than 5 degrees, which means the power amplifiers must be selected and matched according to extremely strict standards.

It can thus be seen that the solution imposes extremely high, nearly excessive, requirements on manufacturing process and the consistency of devices. Otherwise it would be very hard for the isolation between sectors to reach 25 dB, a parameter which has already failed to satisfy the requirements of CDMA system protocols, not to mention the requirements concerning the adjacent channel interference in special sector configuration. Furthermore, when the system is running, if a power amplifier of the system is needed to be replaced, a replacement of exactly the same gain and phase must be found. This is usually another power amplifier from the same manufacturer and in the same batch with the original one. Otherwise the four amplifiers should be replaced all together with another selected matched four power amplifiers. The poor interchangeability of modules further limits the batch application.

Single pole double throw (SPDT) microwave switches are widely applied to RF systems or microwave systems for switching signals. Power dividers are also widely adopted in RF systems for dividing input power to multiple shunted circuits according to a certain power ratio, or for a reverse process, i.e., combining power. In a low frequency circuit, because the wavelength is much longer than that of transmission lines or components, the circuit is a lumped circuit in which equal electrical potential are maintained in the transmission lines all the time. However, the characteristics of transmission lines in the field of microwave transmission are different as the wavelength is short enough compared with the length of the transmission lines, i.e., the electrical potential are not equal to each other on the transmission lines. For example, a transmission line of $\lambda/4$ length is an important distributed parameter component in a microwave circuit. As shown in FIG. 3, the transmission from Port 1 to Port 2 is the primary signal path. There is a transmission line of $\lambda/4$ length shunted to ground on the primary signal path. The transmission line of $\lambda/4$ length will not affect the microwave signals because, although the terminal of the transmission line is shorted to ground, the point at a distance of $\lambda/4$ length from the terminal must be open. Unlike the situation in a low frequency circuit, the microwave signals in FIG. 3 will not be transmitted to the grounding point and disappear, but be transmitted smoothly from Port 1 to Port 2 or vice versa.

Based on such characteristic of the transmission line, when the grounding point is replaced by a switch, the whole circuit will be a microwave switch circuit. As shown in FIG. 4, an SPDT microwave switch in the prior art has three ports, namely, the combining port, the first shunt port and the second shunt port, which are connected through 3 transmission lines. The 3 transmission lines feature Z0 characteristic impedance, in a star topology. When switch device SW1 is closed (shorted to ground) and SW2 is open, the first shunt port is connected to the second shunt port; when SW1 is open and SW2 is closed (shorted to ground), the combining port is connected to the first shunt port. The switch devices SW1 and SW2 can be microwave PIN diodes. It can be seen that when a microwave signal is inputted from the combining port, the SPDT microwave switch can only offer two working statuses: 1) signal available at the first shunt port and no signal at the second shunt port; 2) signal available at the second shunt port and no signal at the first shunt port, thus the switch functions properly as an SPDT microwave switch for the signal. According to low frequency circuit theory, when both SW1 and SW2 are open, the signal from the combining port will reach both the first and the second shunt ports, yet the circuit in such status demonstrates a certain disadvantage: the circuit shows inconsistent impedance at Point A (the "tri-line junction") in FIG. 4, which means microwave signals, from whichever port they are inputted, will be reflected back to the input port and the theoretical return loss (RL) of all the ports equals −9.5 dB, which is rather dissatisfying. The RL is generally required to be −18 dB or better for conventional microwave devices, therefore the SPDT microwave switch shows low performance in power dividing and combining, proving a low value in practical application.

There is also a tendency in the prior art which includes a topology consisting of microwave electrical switch chips or microwave relays and power dividers. Though the solution achieves the function of microwave signal switching, dividing and combining, it requires complex circuits and a large number of devices, which leads to low reliability and high cost.

SUMMARY OF THE INVENTION

The embodiments of the present invention provide a 1+1 hot standby system for radio frequency (RF) power amplifier, which can lower the requirements on manufacturing process and module consistency.

The embodiments of the present invention provide two types of single pole double throw (SPDT) microwave switches for the hot standby system of RF power amplifiers, the SPDT microwave switches can switch signals, and divide and combine power.

The embodiments of the present invention provide an 'N+1' hot standby system for RF power amplifiers, the system can offer hot standby and power share for RF power amplifier in N sectors as well as lower the requirements on manufacturing process and module consistency and improve the isolation between sectors.

The embodiments of the present invention provide a '1+1' hot standby method for RF power amplifier, which can lower the requirements on manufacturing process and module consistency.

The embodiments of the present invention provide an 'N+1' hot standby method for RF power amplifiers, the method can offer hot standby and power share for RF power amplifier in N sectors as well as lower the requirements on manufacturing process and module consistency and improve the isolation between sectors.

A hot standby system for radio frequency (RF) power amplifier, includes: a primary RF power amplifier; an auxiliary RF power amplifier; and two single pole double throw (SPDT) microwave switches: a first SPDT microwave switch and a second SPDT microwave switch;

the two SPDT microwave switches each includes a combining port, a first shunt port and a second shunt port;

the combining port of the first SPDT microwave switch is a signal receiving end; the first shunt port of the first SPDT microwave switch is connected to the input port of the primary RF power amplifier; the second shunt port of the first SPDT microwave switch is connected to the input port of the auxiliary RF power amplifier;

the combining port of the second SPDT microwave switch is the signal export end; the first shunt port of the second SPDT microwave switch is connected to the output port of the primary RF power amplifier; the second shunt port of the second SPDT microwave switch is connected to the output port of the auxiliary RF power amplifier;

when the primary RF power amplifier functions properly, a signal inputted from the combining port of the first SPDT microwave switch is transmitted through the first shunt port of the first SPDT microwave switch to the input port of the primary RF power amplifier; after amplified by the primary RF power amplifier, the signal is transmitted to the first shunt port of the second SPDT microwave switch and then to the combining port of the second SPDT microwave switch;

when the primary RF power amplifier fails, a signal inputted from the combining port of the first SPDT microwave switch is transmitted through the second shunt port of the first SPDT microwave switch to the input port of the auxiliary RF power amplifier; after amplified by the auxiliary RF power amplifier, the signal is transmitted to the second shunt port of the second SPDT microwave switch and then to the combining port of the second SPDT microwave switch.

A SPDT microwave switch, includes: a combining port, a first shunt port, a second shunt port, seven transmission lines: a first, a second, a third, a fourth, a fifth, a sixth and a seventh transmission line and three switch devices: a first, a second and a third switch device;

the combining port of the SPDT microwave switch is connected to the first ends of the fourth transmission line, the first transmission line and the second transmission line; the second end of the fourth transmission line is connected to the first ends of the sixth transmission line and the seventh transmission line, and the third switch device is installed between the ground and the junction of the fourth transmission line, the sixth transmission line and the seventh transmission line; the second end of the second transmission line is connected to the first end of the fifth transmission line, and the second switch device is installed between the ground and the junction of the second transmission line and the fifth transmission line; the second end of the fifth transmission line is connected to the second end of the seventh transmission line, and the junction of the fifth transmission line and the seventh transmission line is connected to the first shunt port; the second end of the first transmission line is connected to the first end of the third transmission line, and the first switch device is installed between the ground and the junction of the first transmission line and the third transmission line; the second end of the third transmission line is connected to the second end of the sixth transmission line, and the junction of the third transmission line and the sixth transmission line is connected to the second shunt port;

when a signal is inputted from the combining port, the first and the third switch devices are closed, the second switch device is open, the input signal reaches the first shunt port through the second and the fifth transmission lines;

when a signal is inputted from the combining port, the second and the third switch devices are closed, the first switch device is open, the input signal reaches the second shunt port through the first and the third transmission lines;

when a signal is inputted from the combining port, the first and the second switch devices are closed, the third switch device is open, the input signal is divided into two signals after passing through the fourth transmission line, one of the two signals reaches the first shunt port through the seventh transmission line and the other signal reaches the second shunt port through the sixth transmission line;

when a signal is inputted from the first shunt port, the first and the third switch devices are closed, the second switch device is open, the input signal reaches the combining port through the fifth and the second transmission lines;

when a signal is inputted from the second shunt port, the second and the third switch devices are closed, the first switch device is open, the input signal reaches the combining port through the third and the first transmission lines;

when two signals are inputted from the first and the second shunt ports respectively, the first and the second switch devices are closed, the third switch device is open, the two signals are combined at the junction of the seventh and the sixth transmission lines after passing through the seventh and the sixth transmission lines respectively, and the combined signal reaches the combining port through the fourth transmission line.

Another SPDT microwave switch, includes: a combining port, a first shunt port, a second shunt port, eight transmission lines: a first, a second, a third, a fourth, a fifth, a sixth, a seventh and an eighth transmission line; and four switch devices: a first, a second, a third and a fourth switch device;

the combining port of the SPDT microwave switch is connected to the first ends is of the first transmission line, the second transmission line, the fourth a transmission line and the fourth b transmission line; the second end of the fourth a transmission line is connected to the first end of the sixth transmission line, and the third switch device is installed between the ground and the junction of and the fourth a transmission line and the sixth transmission line; the second end of the fourth b transmission line is connected to the first end of the seventh transmission line, and the fourth switch device is installed between the ground and the junction of the fourth b transmission line and the seventh transmission line; a matching resistance R is installed between the second end of the fourth a transmission line and the second end of the fourth b transmission line; the second end of the first transmission line is connected to the first end of the third transmission line, and the first switch device is installed between the ground and the junction of the first transmission line and the third transmission line; the second end of the second transmission line is connected to the first end of the fifth transmission line, and the second switch device is installed between the ground and the junction of the second transmission line and the fifth transmission line; the second end of the fifth transmission line is connected to the second end of the seventh transmission line, and the junction of the fifth transmission line and the seventh transmission line is connected to the first shunt port; the second end of the third transmission line is connected to the second end of the sixth transmission line, and the junction of the third transmission line and the sixth transmission line is connected to the second shunt port;

when a signal is inputted from the combining port, the first, the third and the fourth switch devices are closed, the second switch device is open, the input signal reaches the first shunt port through the second and the fifth transmission lines;

when a signal is inputted from the combining port, the second, the third and the fourth switch devices are closed, the first switch device is open, the input signal reaches the second shunt port through the first and the third transmission lines;

when a signal is inputted from the combining port, the first and the second switch devices are closed, the third and the fourth switch devices are open, the input signal is divided into two signals, one of the two signals reaches the first shunt port through the fourth b transmission line and the seventh transmission line and the other signal reaches the second shunt port through the fourth a transmission line and the sixth transmission line;

when a signal is inputted from the first shunt port, the first, the third and the fourth switch devices are closed, the second switch device is open, the input signal reaches the combining port through the fifth and the second transmission lines;

when a signal is inputted from the second shunt port, the second, the third and the fourth switch devices are closed, the first switch device is open, the input signal reaches the combining port through the first and the third transmission lines;

when two signals are inputted from the first and the second shunt ports respectively, the first and the second switch devices are closed, the third and the fourth switch devices are open, one of the two signals reaches the combining port through the sixth transmission line and the fourth a transmission line and the other signal reaches the combining port through the seventh transmission line and the fourth b transmission line.

A hot standby system for RF power amplifier, includes: an auxiliary RF power amplifier; N primary RF power amplifiers; and 2N single pole double throw (SPDT) microwave switches; and N is a natural number;

N SPDT microwave switches are installed at the input sides of the N primary RF power amplifiers; and the other N SPDT microwave switches are installed at the output sides of the N primary RF power amplifiers; and the 2N SPDT microwave switches each includes a combining port, a first shunt port and a second shun port;

the combining port of each of the N SPDT microwave switches installed at the input sides of the primary RF power amplifiers is an signal receiving end; the first shunt port of each of the N SPDT microwave switches installed at the input sides of the primary RF power amplifiers is connected to the input port of the primary RF power amplifiers, the second shunt port of each of the N SPDT microwave switches installed at the input sides of the primary RF-power amplifiers is connected to the input port of the auxiliary RF power amplifier;

the combining port of each of the N SPDT microwave switches installed at the output sides of the primary RF power amplifiers is a signal export end, the first shunt port of each of the N SPDT microwave switches installed at the output sides of the primary RF power amplifiers is connected to the output port of the primary RF power amplifiers, the second shunt port of each of the N SPDT microwave switches installed at the output sides of the primary RF power amplifiers is connected to the output port of the auxiliary RF power amplifier;

when a primary RF power amplifier functions properly, a signal inputted from the combining port of a SPDT microwave switch installed at the input side of the primary RF power amplifier is transmitted through the first shunt port of the SPDT microwave switch installed at the input side of the primary RF power amplifier to the input port of the primary RF power amplifier; after amplified by the primary RF power amplifier, the signal is transmitted to the first shunt port of a SPDT microwave switch installed at the output side of the primary RF power amplifier and then to the combining port of the SPDT microwave switch installed at the output side of the primary RF power amplifier;

when one primary RF power amplifier fails, a signal inputted from the combining port of a SPDT microwave switch installed at the input side of the one primary RF power amplifier is transmitted through the second shunt port of the SPDT microwave switch installed at the input side of the one primary RF power amplifier to the input port of the auxiliary RF power amplifier; after amplified by the auxiliary RF power amplifier, the signal is transmitted to the second shunt port of a SPDT microwave switch installed at the output side of the one primary RF power amplifier and then to the combining port of the SPDT microwave switch installed at the output side of the one primary RF power amplifier.

A hot standby method for radio frequency (RF) power amplifier, adopting the hot standby system including a primary RF power amplifier and an auxiliary RF power amplifier described above, includes:

when the primary RF power amplifier functions properly, setting the statuses of switch devices of the first and the second SPDT microwave switches to transmit a signal inputted from the combining port of the first SPDT microwave switch through the first shunt port of the first SPDT microwave switch to the input port of the primary RF power amplifier; amplify the signal by the primary RF power amplifier; transmit the amplified signal to the first shunt port of the second SPDT microwave switch and then to the combining port of the second SPDT microwave switch for export;

when the primary RF power amplifier fails, setting the statuses of switch devices of the first and the second SPDT microwave switches to transmit a signal inputted from the combining port of the first SPDT microwave switch through the second shunt port of the first SPDT microwave switch to the input port of the auxiliary RF power amplifier; amplify the signal by the auxiliary RF power amplifier; transmit the amplified signal to the second shunt port of the second SPDT microwave switch and then to the combining port of the second SPDT microwave switch for export.

A hot standby method for radio frequency (RF) power amplifier, adopting the hot standby system including N primary RF power amplifier and an auxiliary, includes:

when a primary RF power amplifier function properly, setting the status of the switch devices of the SPDT microwave switches installed at the input and output sides of the primary RF power amplifier to transmit a signal inputted from the combining port of the SPDT microwave switch installed at the input side of the primary RF power amplifier through the first shunt port of the SPDT microwave switch installed at the input side of the primary RF power amplifier to the input port of the primary RF power amplifier; amplify the signal by the primary RF power amplifier, and transmit the amplified signal to the first shunt port of the SPDT microwave switch installed at the output side of the primary RF power amplifier and then to the combining port of the SPDT microwave switch installed at the output side of the primary RF power amplifier for export;

when one primary RF power amplifier fails, setting the status of the switch devices of the SPDT microwave switches installed at the input and output sides of the one primary RF power amplifier to transmit a signal inputted from the combining port of the SPDT microwave switch installed at the input side of the one primary RF power amplifier through the second shunt port of the SPDT microwave switch installed at the input side of the one primary RF power amplifier to the input port of the auxiliary RF power amplifier; amplify the signal by the auxiliary RF power amplifier, and transmit the amplified signal to the second shunt port of the SPDT microwave switch installed at the output side of the one primary RF power amplifier and then to the combining port of the SPDT microwave switch installed at the output side of the one primary RF power amplifier for export.

A hot standby system for radio frequency (RF) power amplifier, includes: a primary RF power amplifier, an auxiliary RF power amplifier, a first microwave switch, and a second microwave switch;

the first and the second microwave switches each includes: a combining port, a first shunt port and a second shunt port;

the combining port of the first microwave switch is a signal receiving end; the first shunt port of the first microwave switch is connected to the input port of the primary RF power amplifier; and the second shunt port of the first microwave switch is connected to the input port of the auxiliary RF power amplifier;

the combining port of the second microwave switch is a signal export end; the first shunt port of the second microwave switch is connected to the output port of the primary RF power amplifier; and the second shunt port of the second microwave switch is connected to the output port of the auxiliary RF power amplifier;

the first and the second microwave switches each further includes: a first transmission line, a second transmission line, a third transmission line, a fourth transmission line, a first switch device, a second switch device, a third switch device, and a power dividing/combining component; and the power dividing/combining component comprises a combining port, a tri-line junction, a first shunt port and a second shunt port;

the combining port of the microwave switch is connected to the first shunt port of the microwave switch through the first transmission line and the second transmission line; the junction of the first transmission line and the second transmission line is connected to ground through the first switch device;

the combining port of the microwave switch is further connected to the second shunt port of the microwave switch through the third transmission line and the fourth transmission line; the junction of the third transmission line and the fourth transmission line is connected to ground through the second switch device;

the combining port of the power dividing/combining component is connected to the junction of the first transmission line and the third transmission line; the first shunt port of the power dividing/combining component is connected to the first shunt port of the microwave switch device; the second shunt port of the power dividing/combining component is connected to the second shunt port of the microwave switch device; the tri-line junction of the power dividing/combining component is connect to ground through the third switch device.

It can be seen from the fore-going technical scheme that an auxiliary RF power amplifier is adopted in the systems according to the embodiments of the present invention and SPDT microwave switches are installed at the input and the output ports of the RF power amplifiers in the system for controlling whether to make the auxiliary RF power amplifier function. In the hot standby systems described above, every signal passes through a power amplifier and there is an auxiliary power amplifier being shared by the whole system instead of belonging to any single circuit in the system. Therefore, when a power amplifier fails, the auxiliary power amplifier can immediately, as a hot standby, take over the functions of the failed power amplifier without cutting off the power or stopping the operation of the whole system. Because each one of the N power amplifiers deals with signals in one circuit only, the isolation between signals in the system is independent of the consistency of power amplifiers and is thus kept at a high level. Meanwhile, SPDT microwave switches are adopted to perform switch between the primary and the auxiliary RF power amplifiers, which do not raise strict requirements on the consistency of devices including power amplifiers. So the hot standby systems and methods provided by the embodiments of the present invention are highly practical, and are easy to spread and be adopted in communication networks.

Furthermore, the two types of SPDT microwave switches according to the embodiments of the present invention can switch signals, and divide and combine power, so the SPDT microwave switches can be adopted in a wider scope; the transmission line topology of the SPDT microwave switches described in the technical scheme is simple and subtle, adopting simple circuit topology and mature production technology, requiring low cost and easy to be applied, the topology also provides excellent port impedance matching performance so that no signal is reflected at a port, therefore the SPDT microwave switches are also highly practical and can be adopted in amplifier hot standby and power share systems.

EMBODIMENTS OF THE INVENTION

The present invention is hereinafter further described in detail with reference to the accompanying drawings as well as embodiments so as to make the technical solution and merits thereof more apparent.

The embodiments of the present invention provide '1+1' hot standby and 'N+1' hot standby system and method for an RF power amplifier by adopting SPDT microwave switches and extra RF power amplifier in the system. The embodiments of the present invention also provide two types of SPDT microwave switches that can be adopted in the RF power amplifier hot standby system.

Three preferred embodiments of the present invention are described herein to illustrate the '1+1' RF power amplifier hot standby system and method provided by the present invention and the two types of SPDT microwave switches adopted in the RF power amplifier hot standby system.

Figure 5:
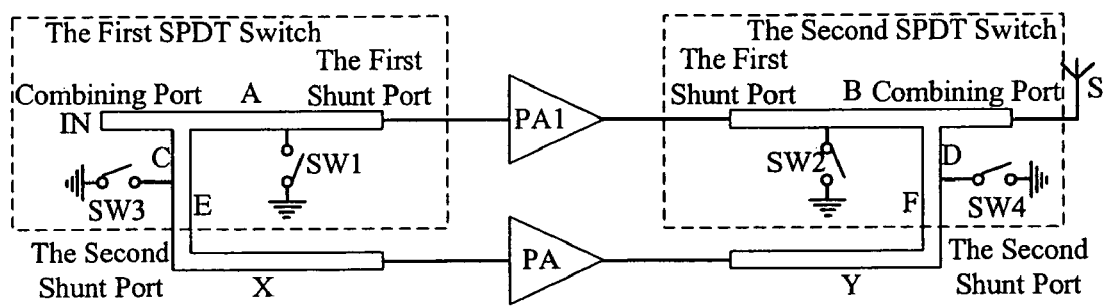
FIG. 5 is a schematic diagram illustrating the topology of the '1+1' RF power amplifier hot standby system according to a first preferred embodiment of the present invention.

FIG. 5 is a schematic diagram illustrating the system topology of the '1+1' radio frequency power amplifier hot standby system according to a first embodiment of the present invention. The system includes two identical SPDT microwave switches: a first SPDT microwave switch and a second SPDT microwave switch. The system also includes two identical RF power amplifiers (Also referred to as 'power amplifier') PA1 and PA, and PA1 can be the primary RF power amplifier and PA can be the auxiliary RF power amplifier, or PA1 can function as the auxiliary RF power amplifier and PA as the primary RF power amplifier.

The combining port of the first SPDT microwave switch is a signal receiving end. The first shunt port of the first SPDT microwave switch is connected to the input port of PA1, and the second shunt port of the first SPDT microwave switch is connected to the input port of PA. The combining port of the second SPDT microwave switch is a signal transmit end and is connected to Antenna S. The first shunt port of the second SPDT microwave switch is connected to the output port of PA1, and the second shunt port of the second SPDT microwave switch is connected to the output port of PA.

Figure 1:
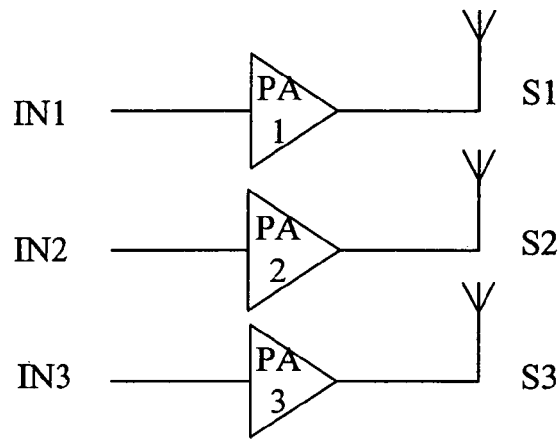
FIG. 1 is a schematic diagram illustrating a conventional 3-sector power amplifier system without hot standby and power share.
Figure 2:
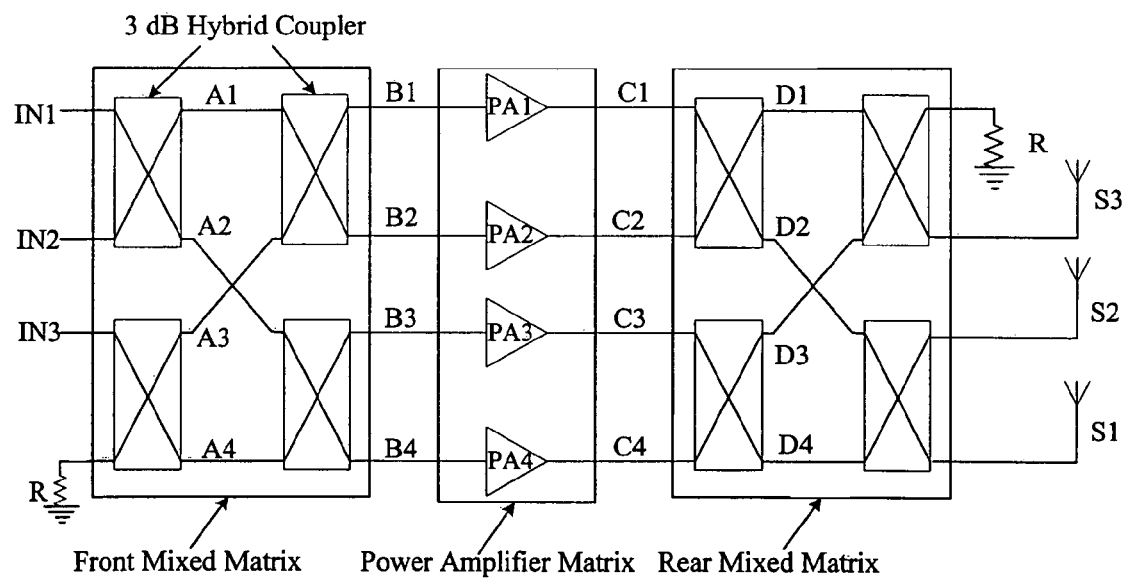
FIG. 2 is a schematic diagram illustrating a hot standby system consisting of hybrid matrix in the prior art.
Figure 3:
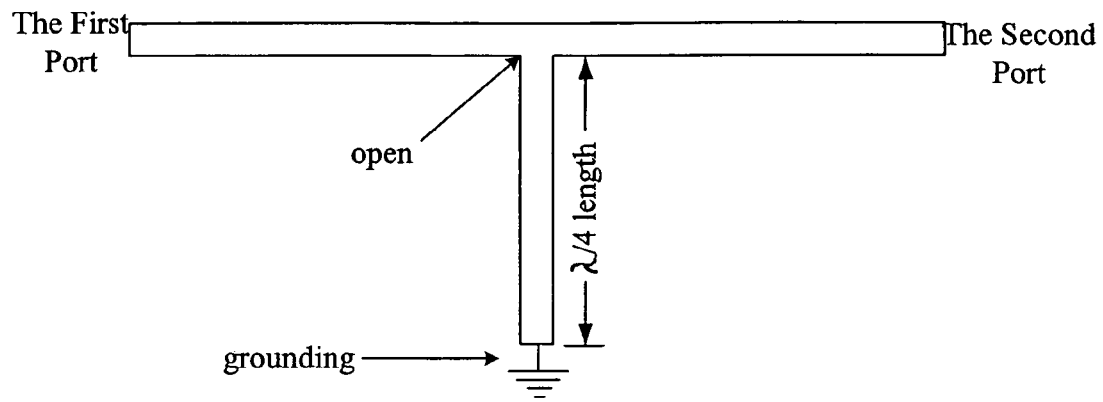
FIG. 3 is a schematic diagram illustrating a $\lambda/4$ length transmission line with an end shorting to ground in the prior art.
Figure 4:
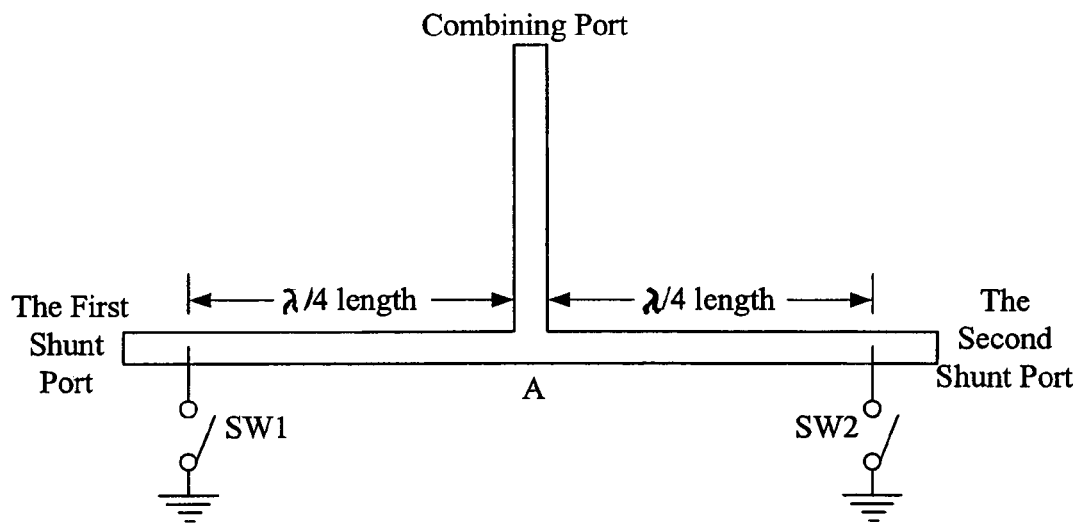
FIG. 4 is a schematic diagram illustrating an SPDT microwave switch topology in the prior art.

SPDT microwave switches in the prior art, as shown in FIG. 4, are adopted as the first and the second SPDT microwave switches in this embodiment. Switch device SW1 in the first SPDT microwave switch and switch device SW2 in the second SPDT microwave switch are in linkage; and switch device SW3 in the first SPDT microwave switch and switch device SW4 in the second SPDT microwave switch are in linkage.

If PA1 is the primary power amplifier and PA is the auxiliary power amplifier, when PA1 functions properly, SW3 and SW4 are closed (shorted to ground) and SW1 and SW2 are open. Signals are inputted at the combining port of the first SPDT microwave switch, transmitted through transmission line A to PA1 to be amplified, and then transmitted through transmission line B to Antenna S. When PA1 fails, the first and the second SPDT microwave switches are switched to another working status in which SW3 and SW4 are open, SW1 and SW2 are closed (shorted to ground). Signals are inputted at the combining port of the first SPDT microwave switch, transmitted through transmission lines C, E and X to PA1 to be amplified, and then transmitted through transmission lines Y, F and D to Antenna S. Therefore the '1+1' radio frequency power amplifier hot standby is achieved.

In practice, there can be a third working status: SW1, SW2, SW3 and SW4 are all open. However, due to the demerit of the SPDT microwave switches adopted in this embodiment, the return losses (RL) at the ports in the third working status of the SPDT microwave switches are too large and the power dividing and combining functions thereof are thus too poor to achieve power share. Hence the solution in the first preferred embodiment is not recommended in practice, while the solutions in a second preferred embodiment and a third preferred embodiment are recommended.

Figure 6:
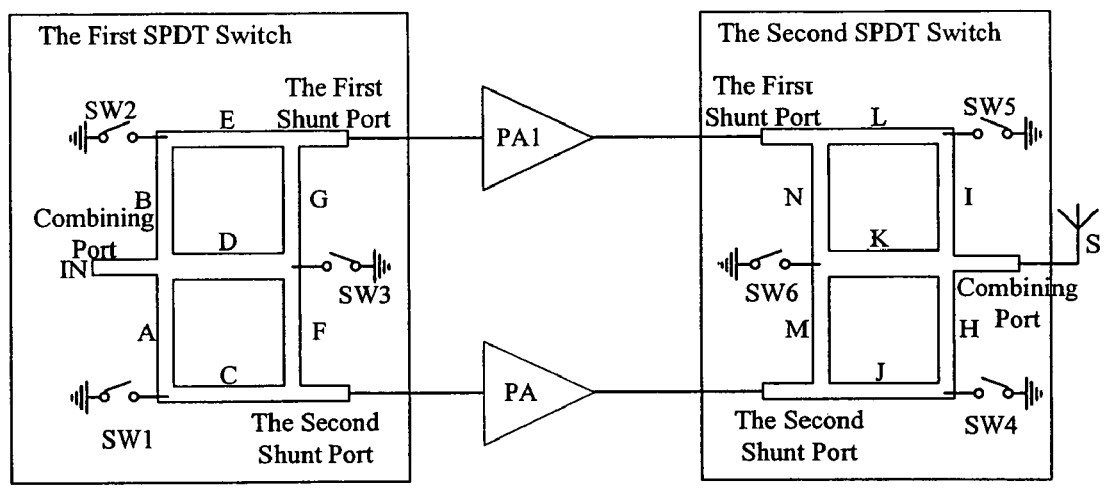
FIG. 6 is a schematic diagram illustrating the topology of the '1+1' RF power amplifier hot standby system according to a second preferred embodiment of the present invention.

FIG. 6 is a schematic diagram illustrating the system topology of the '1+1' RF power amplifier hot standby system according to the second preferred embodiment of the present invention. The system includes two identical SPDT microwave switches: a first SPDT microwave switch and a second SPDT microwave switch; the system also includes two identical RF power amplifiers PA1 and PA, in which PA1 can be the primary RF power amplifier and PA can be the auxiliary RF power amplifier.

The combining port of the first SPDT microwave switch is a signal receiving end, the first shunt port of the first SPDT microwave switch is connected to the input port of PA1, and the second shunt port of the first SPDT microwave switch is connected to the input port of PA. The combining port of the second SPDT microwave switch is a signal transmit end and is connected to an antenna S, the first shunt port of the second SPDT microwave switch is connected to the output port of PA1, and the second shunt port of the second SPDT microwave switch is connected to the output port of PA.

The first SPDT microwave switch in this embodiment includes: three ports including a combining port, a first shunt port and a second shunt port; seven transmission lines including transmission lines A, B, C, D, E, F and G; and three switch devices including SW1, SW2 and SW3. The seven transmission lines are $\lambda/4$ length long each, connected to each other to form a "目"-shaped topology, and each of the transmission line is connected to a switch device to form a microwave switch.

The combining port of the first SPDT microwave switch is connected to the first ends of the fourth transmission line D, the first transmission line A and the second transmission line B; the second end of the fourth transmission line D is connected to the first ends of the sixth transmission line F and the seventh transmission line G, and the third switch device SW3 is installed between the ground and the junction of the transmission lines D, G and F; the second end of the second transmission line B is connected to the first end of the fifth transmission line E, and the second switch device SW2 is installed between the ground and the junction of the transmission lines B and E; the second end of the fifth transmission line E is connected to the second end of the seventh transmission line G, and the junction of the transmission lines E and G is connected to the first shunt port; the second end of the first transmission line A is connected to the first end of the third transmission line C, and the first switch device SW1 is installed between the ground and the junction of the transmission lines A and C; the second end of the third transmission line C is connected to the second end of is the sixth transmission line F, and the junction of the transmission lines C and F is connected to the second shunt port.

In the topology described above, the characteristic impedance of the transmission lines A, B, C, E, F and G is Z0 and the characteristic impedance of the transmission line D is described as below:

$$\frac{Z0}{\sqrt{2}}.$$

When a microwave signal is inputted at the combining port of the first SPDT microwave switch topology as described above, the working statuses and the signal switching and dividing functions of the SPDT microwave switch include the following:

Working Status 1: SW1 is set to be closed (shorted to ground), SW2 is set to be open and SW3 is set to be closed (shorted to ground). Because SW1 is closed (shorted to ground), the microwave signal from the combining port will not pass through the transmission line A; similarly, as SW3 is closed (shorted to ground), the signal will not pass through the transmission line D either, therefore the signal can only be transmitted through the transmission lines B and E; and because SW3 is closed (shorted to ground), the signal from the transmission line E cannot pass through the transmission line G, so the signal can only reach the first shunt port, i.e., the signal can be transmitted from the combining port straight through to the first shunt port while the combining port is electronically isolated from the second shunt port, so that the signal can be exported at the first shunt port.

Working Status 2: SW1 is set to be open, SW2 is set to be closed (shorted to ground) and SW3 is set to be closed (shorted to ground). Because SW2 is closed (shorted to ground), the microwave signal from the combining port will not pass through the transmission line B; similarly, as SW3 is closed (shorted to ground), the signal will not pass through the transmission line D either, therefore the signal can only be transmitted through the transmission lines A and C; and because SW3 is closed (shorted to ground), the signal from the transmission line C cannot pass through the transmission line F, so the signal can only reach the second shunt port, i.e., the signal can be transmitted from the combining port straight through to the second shunt port while the combining port is electronically isolated from the first shunt port, so that the signal can be exported at the second shunt port.

It can be concluded from Working Status 1 and Working Status 2 that the SPDT microwave switch, the topology of which is described in the fore-going descriptions, is able to perform signal switching.

Figure 7:
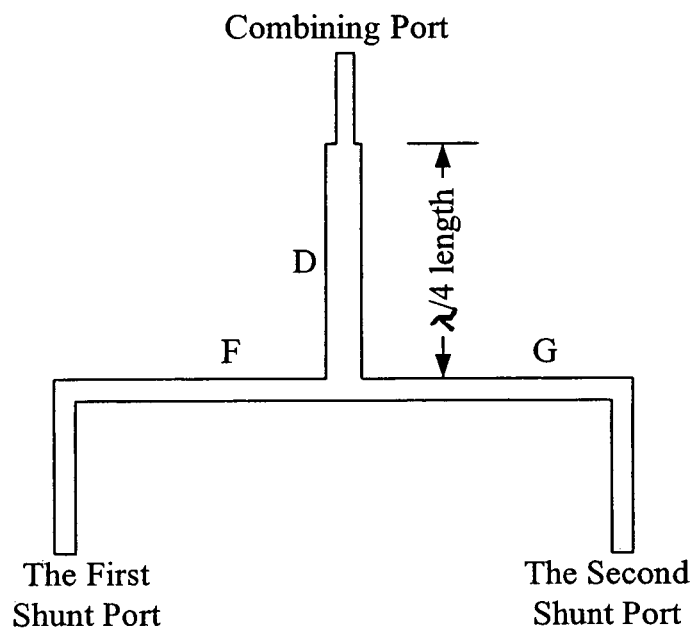
FIG. 7 is a schematic diagram illustrating an SPDT microwave switch which is an equivalent of a power divider in the system illustrated in FIG. 6.

Working Status 3: SW1 is set to be closed (shorted to ground), SW2 is set to be closed (shorted to ground) and SW3 is set to be open. As SW1 is closed (shorted to ground), the microwave signal from the combining port cannot pass through the transmission line A; similarly, as SW2 is closed (shorted to ground), the microwave signal from the combining port cannot pass through the transmission line B either, therefore the signal can only be transmitted through the transmission line D. The signal is divided into two signals with equal power at the junction of the transmission lines F and G, one of the signals passes through the transmission line F and reaches the second shunt port; as SW1 is closed (shorted to ground) and the signal thus cannot pass through the transmission line C; the other signal passes through the transmission line G to reach the first shunt port. The circuit equivalent of the whole SPDT microwave switch in such working status is shown in FIG. 7, which is a schematic diagram illustrating an SPDT microwave switch as an equivalent of a power divider in the system illustrated in FIG. 6. The input signal from the combining port is divided into two signals with equal powers which reach the first and the second shunt ports respectively, which shows that the SPDT microwave switch has the function of a power divider.

The SPDT microwave switch in the third working status as shown in FIG. 7 is different from the "line conjunction" Point A of the prior art in FIG. 4, both ends of the transmission line D demonstrates impedance discontinuity, but the transmission line D has the following characteristics: the input impedance at the first end of the transmission line D is Z0; the second end of the transmission line D equals the shunt connection of the transmission lines F and G, both of which has the characteristic impedance of Z0, therefore the input impedance at the second end of the transmission line D is Z0/2; thus the characteristic impedance of the transmission line D is $$\frac{Z0}{\sqrt{2}},$$

the length of the transmission line D is λ/4 length; so the transmission line D is a well known impedance transformer, which does not reflect signals at the central frequency and reflects only neglectable signals near the central frequency, thereby the transmission line has a practical value.

In the SPDT microwave switch described in the fore-going descriptions, when microwave signals are inputted from the first shunt port only or from the second shunt port only, the operation of the switch is similar to that of the fore-going descriptions, and the switch is equal to a conventional SPDT microwave switch. When microwave signals with identical amplitude and phase are inputted from both the first and the second shunt port, if SW1 and SW2 are closed (shorted to ground) and SW3 is open, the SPDT microwave switch can function as a power combiner as shown in the second SPDT microwave switch in FIG. 6.

The second SPDT microwave switch in FIG. 6 has the same topology as the first SPDT microwave switch, the only difference between them is the part codes assigned to the transmission lines and switch devices. In the second SPDT microwave switch, when a signal is inputted at the first shunt port only, SW6 and SW4 are closed (shorted to ground) and SW5 is open, the signal will reach the combining port through the transmission lines L and I to be exported to Antenna S; when a signal is inputted at the second shunt port only, SW5 and SW6 are closed (shorted to ground) and SW4 is open, the signal will reach the combining port through the transmission lines J and H to be exported to the Antenna S; when two signals with the same amplitude and phase are inputted at both the first and the second shunt port, SW4 and SW5 are closed (shorted to ground) and SW6 is open, the two signals will pass through the transmission lines M and N respectively, be combined at the junction of the transmission lines M and N into one signal which then reaches the combining port through the transmission line K to be exported to the Antenna S.

The topology of the SPDT microwave switch according to an embodiment of the present invention is very subtle, each of the transmission lines including A, B, C, D, E, F and G can form a microwave switch with a switch device. For example, the sixth transmission line F and the third switch device SW3 can form a microwave switch, the transmission lines D and G can also form microwave switches with SW3 respectively. Thus it can be seen that functions of seven microwave switches can be achieved with only three switch devices, and the circuit topology thereof is simple. Furthermore, the transmission lines can be PCB micro-striplines or striplines, which have already been a part of mature PCB technology; the switch devices can be, but are not limited to, microwave PIN diodes, PIN diodes are also mature technology and easy to access. Therefore the technical scheme according to this embodiment of the present invention is easy to apply and the cost thereof is low.

In the system shown in FIG. 6, SW1 of the first SPDT microwave switch and SW4 of the second SPDT microwave switch are in linkage, SW2 of the first SPDT microwave switch and SW5 of the second SPDT microwave switch are in linkage, and SW3 of the first SPDT microwave switch and SW6 of the second SPDT microwave switch are in linkage, so that the RF power amplifier hot standby and power share can be achieved.

The system shown in FIG. 6 has three working statuses.

In Working Status 1, SW1, SW3, SW4 and SW6 are closed (shorted to ground) while SW2 and SW5 are open, according to the working principle of the SPDT microwave switch with power dividing and combining functions as described above, an input signal is transmitted from the combining port of the first SPDT microwave switch to the first shunt port of the first SPDT microwave switch through the transmission lines B and E; after being amplified by the power amplifier PA1, the signal is transmitted to the first shunt port of the second SPDT microwave switch and eventually sent to the Antenna S through the transmission line L and I. No signal is transmitted to the auxiliary RF power amplifier PA. Therefore, no signal will be exported from PA, i.e., the power amplifier PA does not function in the first working status.

In Working Status 2, SW2, SW3, SW5 and SW6 are closed (shorted to ground) while SW1 and SW4 are open, an input signal is transmitted from the combining port of the first SPDT microwave switch to the second shunt port of the first SPDT microwave switch through the transmission lines A and C; after being amplified by the auxiliary power amplifier PA, the signal is transmitted to the second shunt port of the second SPDT microwave switch and eventually sent to the antenna S through the transmission lines J and H. In this working status, the power amplifier PA1 does not function.

In Working Status 3, SW1, SW2, SW4 and SW5 are closed (shorted to ground) while SW3 and SW6 are open, an input signal is transmitted from the combining port of the first SPDT microwave switch to the transmission line D, and then the signal is divided into two signals with equal amplitude and phase. One of the two signals reaches the first shunt port of the first SPDT microwave switch through the transmission line G, and then amplified by the power amplifier PA, and the amplified signal is sent to the first shunt port of the second SPDT microwave switch and to the transmission line M. The other signal reaches the second shunt port of the first SPDT microwave switch through the transmission line F, and then amplified by power amplifier PA1, the amplified signal is sent to the second shunt port of the second SPDT microwave switch and to the transmission line N. If the consistency of the gain and phase of both power amplifiers are quite well, the amplitude and phase of the two signals on the transmission lines M and N will also be identical. The two signals are then combined and transmitted to the Antenna S through the transmission line K.

Among the three working statuses described above, the first working status (PA1 functions and PA does not function) can be regarded as the normal status of the power amplifiers, the second working status (PA functions and PA1 does not function) can be regarded as the hot standby status, and the third working status (both PA1 and PA function) can be regarded as the power share status; power amplifier PA in the embodiment is the standby of power amplifier PA1.

Figure 8:
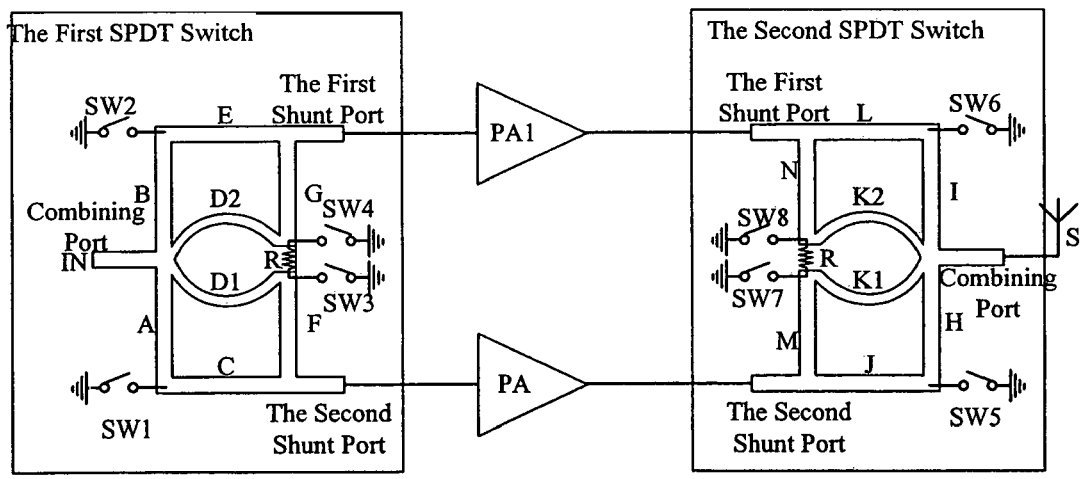
FIG. 8 is a schematic diagram illustrating the topology of the '1+1' RF power amplifier hot standby system according to a third preferred embodiment of the present invention.

FIG. 8 is a schematic diagram illustrating the topology of the '1+1' RF power amplifier hot standby system according to the third preferred embodiment of the present invention. The system includes two identical SPDT microwave switches: the first SPDT microwave switch and the second SPDT microwave switch; the system also includes two identical RF power amplifiers PA1 and PA, in which PA1 can be the primary RF power amplifier and PA can be the auxiliary RF power amplifier.

The combining port of the first SPDT microwave switch is a signal receiving end, the first shunt port of the first SPDT microwave switch is connected to the input port of PA1, and the second shunt port of the first SPDT microwave switch is connected to the input port of PA. The combining port of the second SPDT microwave switch is a signal transmit end and is connected to Antenna S, the first shunt port of the second SPDT microwave switch is connected to the output port of PA1, and the second shunt port of the second SPDT microwave switch is connected to the output port of PA.

The SPDT microwave switches adopted in this embodiment are an improvement over the SPDT microwave switches adopted in the embodiment shown in FIG. 6.

As shown in FIG. 8, the first SPDT microwave switch in this embodiment includes: a combining port, a first shunt port, a second shunt port, eight transmission lines including A, B, C, D1, D2, E, F and G, four switch devices including SW1, SW2, SW3 and SW4, and one matching resistance R; the eight transmission lines and the matching resistance are connected with each other to form a "日"-shaped topology.

The combining port of the first SPDT microwave switch is connected to the first ends of the first transmission line A, the second transmission line B, the fourth 'a' transmission line D1 and the fourth 'b' transmission line D2; the second end of the fourth 'a' transmission line D1 is connected to the first end of the sixth transmission line F, and the third switch device SW3 is installed between the ground and the junction of the transmission lines D1 and F; the second end of the fourth 'b' transmission line D2 is connected to the first end of the seventh transmission line G, and the fourth switch device SW4 is installed between the ground and the junction of the transmission lines D2 and G; a matching resistance R is installed between the second end of the fourth transmission line D1 and the second end of the fourth transmission line D2; the second end of the first transmission line A is connected to the first end of the third transmission line C, and the first switch device SW1 is installed between the ground and the junction of the transmission lines A and C; the second end of the second transmission line B is connected to the first end of the fifth transmission line E, and the second switch device SW2 is installed between the ground and the junction of the transmission lines B and E; the second end of the fifth transmission line E is connected to the second end of the seventh transmission line G, and the junction of the transmission lines E and G is connected to the first shunt port; the second end of the third transmission line C is connected to the second end of the sixth transmission line F, and the junction of the transmission lines F and C is connected to the second shunt port.

In the SPDT microwave switch topology described above, the length of each of the eight transmission lines is $\lambda/4$ length, the characteristic impedance of the transmission lines A, B, C, E, F and G is $Z0$, the characteristic impedance of the transmission lines D1 and D2 is $\sqrt{2}Z0$, and the resistance value of the matching resistance is $2Z0$. The transmission lines D1 and D2 and the resistance R form a standard Wilkinson equal-power divider, in which the matching resistance can function as an isolator so as to improve the matching characteristics of the ports.

The SPDT microwave switch in this embodiment also has three working statuses.

Working Status 1:

The first, third and fourth switch devices, i.e., the SW1, SW3 and SW4 are closed (shorted to ground), and the second switch device SW2 is open. When a signal is inputted to the combining port, the input signal is transmitted to the first shunt port through the second and the fifth transmission lines, i.e., the transmission lines B and E;

Working Status 2:

The second, the third and the fourth switch devices, i.e., the SW2, SW3 and SW4 are closed (shorted to ground), the first switch device SW1 is open; when a signal is inputted to the combining port, the input signal is transmitted to the second shunt port through the first and the third transmission lines, i.e., the transmission lines A and C;

Working Status 3:

The first and the second switch devices, i.e., the SW1 and SW2, are closed (shorted to ground), the third and the fourth switch devices, i.e., the SW3 and SW4, are open; when a signal is inputted to the combining port, the input signal is divided into two signals, one of the signals reaches the first shunt port through the fourth b transmission line and the seventh transmission line, i.e., the transmission lines D2 and G, and the other reaches the second shunt port through the fourth a transmission line and the sixth transmission line, i.e., the transmission lines D1 and F.

In the SPDT microwave switch in this embodiment, if a signal is inputted at the first shunt port only, the first, the third and the fourth switch devices are closed (shorted to ground) and the second switch device is open, the input signal will reach the combining port through the fifth and the second transmission line; if the signal is inputted at the second shunt port only, the second, the third and the fourth switch devices are closed (shorted to ground) and the first switch device is open, the input signal will reach the combining port through the third and the first transmission line; if two signals are inputted at the first and the second shunt ports respectively, the first and the second switch devices are closed (shorted to ground) and the third and the fourth switch devices are open, one of the signals will reach the combining port through the sixth transmission line and the fourth a transmission line, the other signal will reach the combining port through the seventh transmission line and the fourth b transmission line.

The second SPDT microwave switch in FIG. 8 has the same topology as the first SPDT microwave switch, the only difference is the part codes assigned to the transmission lines and switch devices. The switching between the primary RF power amplifier and the auxiliary RF power amplifier is achieved through the linkage of identical switch devices in the first and the second SPDT microwave switch in this embodiment.

When the primary RF power amplifier functions properly, the first, the third and the fourth switch devices of both the first and the second SPDT microwave switches are closed (shorted to ground), the second switch devices of them are open; or the first and the second switch devices of both the first and the second SPDT microwave switches are closed (shorted to ground), the third and the fourth switch devices of them are open.

When the primary RF power amplifier fails, the second, third and fourth switch devices of both the first and the second SPDT microwave switches are closed (shorted to ground), the first switch devices of them are open.

In other words, the first and the second SPDT microwave switches in this embodiment have the same functions as the SPDT microwave switches in the embodiment shown in FIG. 6 concerning the signal switching, signal dividing and signal combining, no matter what microwave signals are inputted at their combining ports, or at their first and/or second shunt ports. The difference is that the SW3 and SW4 in this embodiment are regarded as linkage switches which are closed (shorted to ground) or open synchronously and provides switching functions equal to those of SW3 or SW6 in FIG. 6. Hence, the standby system in this embodiment functions according to the same principle as that in the embodiment shown in FIG. 6 and is not repeated herein.

The SPDT microwave switches in this embodiment have the same functions as the SPDT microwave switches in the embodiment shown in FIG. 6 concerning the signal switching, power dividing and combining. However in every switch in this embodiment an additional transmission line and a matching resistance are added, each of the transmission lines A, B, C, D1, D2, E, F and G can also form a basic microwave switch with a switch device, moreover, the transmission lines can also be micro-striplines or striplines and the switch devices can be microwave PIN diodes, therefore the switches also have the advantages including simple circuit topology, mature production technology, low cost and high practicability.

In the '1+1' RF power amplifier hot standby systems shown in FIG. 6 and FIG. 8, every sector has its own auxiliary power amplifier PA; in normal situation both of the two power amplifiers in the sector work in parallel, and when either of the two power amplifiers fails, the failed power amplifier is cut off through switching operation while the other power amplifier remains working with an output power decrease of 3 dB. The system can be applied to any sector alone. When every sector (e.g., in a 3-sector application) adopts the system as shown in FIG. 6 or FIG. 8, because the sectors are independent of each other and are insulated from each other, the problem of sector isolation is not exist any more.

'N+1' RF power amplifier hot standby can be achieved referring to the '1+1' RF power amplifier hot standby principle. Another three preferred embodiments of 3+1 RF power amplifier hot standby are provided hereafter to explain the 'N+1' hot standby system and method for RF power amplifier.

Figure 9:
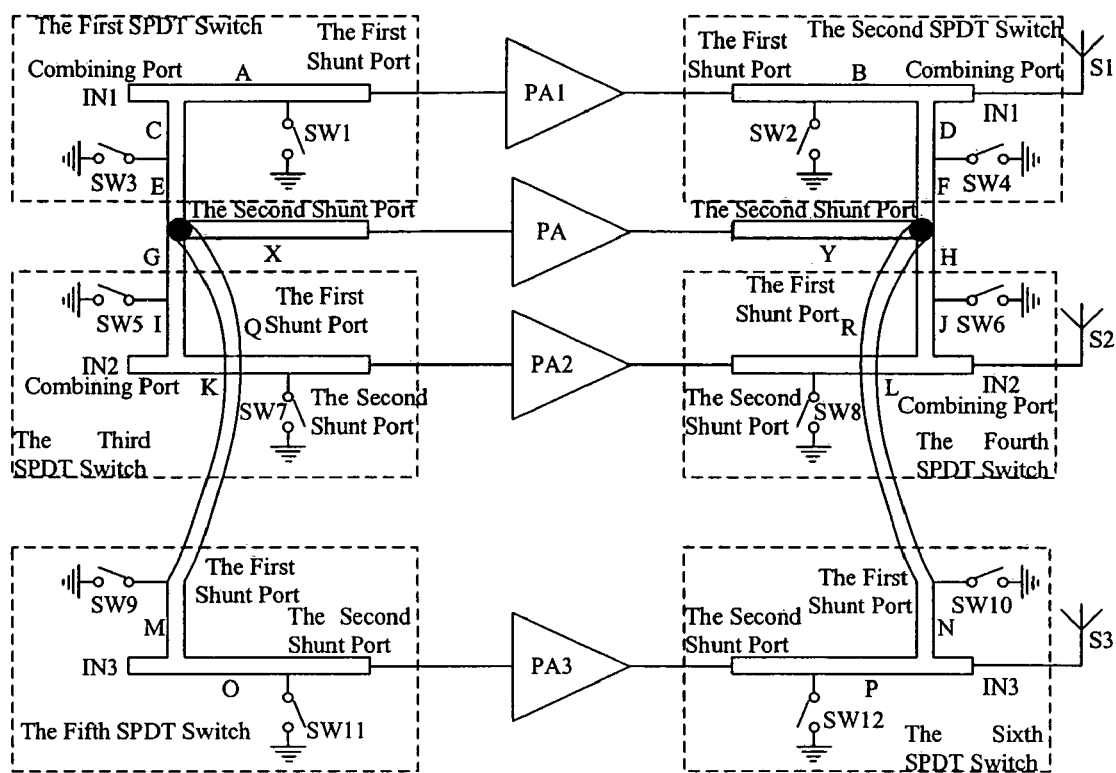
FIG. 9 is a schematic diagram illustrating the topology of the 'N+1' RF power amplifier hot standby system according to a fourth preferred embodiment 1 of the present invention.

FIG. 9 is a schematic diagram illustrating the topology of the 'N+1' RF power amplifier hot standby system according to the fourth preferred embodiment of the present invention. 3+1 hot standby for RF power amplifiers in a 3-sector application is achieved in this embodiment based on the working principle of the embodiment in FIG. 5.

The system shown in FIG. 9 includes six identical SPDT microwave switches from the first SPDT microwave switch to the sixth SPDT microwave switch, and four identical RF power amplifiers including PA1, PA2, PA3 and PA. The six SPDT microwave switches are also identical with the SPDT microwave switches in the embodiment shown in FIG. 5; power amplifiers PA1, PA2 and PA3 are the power is amplifiers of the three sectors respectively and PA is the auxiliary power amplifier.

As shown in FIG. 9, the combining port of the first SPDT microwave switch receives input signals of the first sector, the first shunt port of the first SPDT microwave switch is connected to the input port of PA1 and the second shunt port of the first SPDT microwave switch is connected to the input port of PA through transmission line X.

The first shunt port of the second SPDT microwave switch is connected to the output port of PA1, the second shunt port of the second SPDT microwave switch is connected to the output port of PA through transmission line Y and the combining port of the second SPDT microwave switch is connected to Antenna S1 of the first sector.

The combining port of the third SPDT microwave switch receives input signals of the second sector, the first shunt port of the third SPDT microwave switch intersects the second shunt port of the first SPDT microwave switch and the second shunt port of the third SPDT microwave switch is connected to the input port of PA2.

The first shunt port of the fourth SPDT microwave switch intersects the second shunt port of the second SPDT microwave switch, the second shunt port of the fourth SPDT microwave switch is connected to the output port of PA2 and the combining port of the fourth SPDT microwave switch is connected to antenna S2 of the second sector.

The combining port of the fifth SPDT microwave switch receives input signals of the third sector, the first shunt port of the fifth SPDT microwave switch intersects the second shunt port of the first SPDT microwave switch and the second shunt port of the fifth SPDT microwave switch is connected to the input port of PA3.

The first shunt port of the sixth SPDT microwave switch intersects the second shunt port of the second SPDT microwave switch, the second shunt port of the sixth SPDT microwave switch is connected to the output port of PA3 and the combining port of the sixth SPDT microwave switch is connected to Antenna S3 of the third sector.

Hot standby and power share for RF power amplifier are achieved in the system shown in FIG. 9 through the switch device linkage between the first and the second SPDT microwave switches, the switch device linkage between the third and the fourth SPDT microwave switches and the switch device linkage between the fifth and the sixth SPDT microwave switches; the system has four working status accordingly.

In a first working status, the three power amplifiers PA1, PA2 and PA3 of the three sectors function properly and the auxiliary power amplifier PA does not work. SW3, SW4, SW5, SW6, SW9 and SW10 are set to be closed (shorted to ground), and SW1, SW2, SW7, SW8, SW11 and SW12 are set to be open; according to the working principle of the SPDT microwave switches described in the fore-going descriptions, input signals are inputted at the combining ports of the first, the third and the fifth SPDT microwave switches respectively, transmitted through transmission lines A, K and O and reach the first shunt port of the first SPDT microwave switch, and the second shunt ports of the third and the fifth SPDT microwave switches; after being amplified respectively by power amplifiers PA1, PA2 and PA3, the signals are transmitted to the first shunt port of the second SPDT microwave switch, and the second ports of the fourth and the sixth SPDT microwave switches and are sent to Antennas S1, S2 and S3 through transmission lines B, L and P respectively.

The first, third and fifth SPDT microwave switches at the input side can be regarded as front microwave switches. SW3, SW5 and SW9 of the front microwave switches are shorted to ground, and are converted to open circuits through λ/4 length impedance conversion at the input sides of PA. Therefore power amplifier PA does not get any input signal. The second, the fourth and the sixth SPDT microwave switches at the output side can be regarded as rear microwave switches. SW4, SW6 and SW10 of the rear microwave switches are shorted to ground, and are converted to open circuits through λ/4 length impedance conversion at the output sides of PA, and no output signal is transmitted to the power amplifier PA.

In a second working status, the power amplifier PA1 of the first sector fails, PA2 and PA3 of the second and the third sectors function properly and the auxiliary power amplifier PA works in place of PA1. In such working status, SW1, SW2, SW5, SW6, SW9 and SW10 are set to be closed (shorted to ground), SW3, SW4, SW7, SW8, SW11 and SW12 are set to be open.

Input signals of the first sector are inputted at the combining port of the first SPDT microwave switch, transmitted through transmission lines C and E, and reach the second shunt port of the first SPDT microwave switch, then the signals are transmitted to auxiliary power amplifier PA through transmission line X to be amplified, and the amplified signal are sent to the second port of the second SPDT microwave switch, and further to the combining port of the second SPDT microwave switch through transmission lines F and D, finally the signals reach antenna S1 of the first sector. At the input side, as SW1 of the first SPDT microwave switch is shorted to ground, and is converted to open circuits through λ/4 length impedance conversion, therefore no input signals passes through transmission line A and the power amplifier PA1 can not get any input signal. At the output side, as SW2 of the second SPDT microwave switch is shorted to ground, and is converted to open circuits through λ/4 length impedance conversion, therefore the signals amplified by PA are exported directly through transmission lines F and D without being transmitted to the power amplifier PA1 through transmission line B.

In a third working status, the power amplifier PA2 of the second sector fails, PA1 and PA3 of the first and the third sectors function properly and the auxiliary power amplifier PA works in place of PA2. In such working status, SW3, SW4, SW7, SW8, SW9 and SW10 are set to be closed (shorted to ground), SW1, SW2, SW5, SW6, SW11 and SW12 are set to be open; the working principle of the system in such status is exactly the same as that in the second working status.

In a fourth working status, the power amplifier PA3 of the third sector fails, PA1 and PA2 of the first and the second sectors function properly and the auxiliary power amplifier PA works in place of PA3. In such working status, SW3, SW4, SW5, SW6, SW11 and SW12 are set to be closed (shorted to ground), SW1, SW2, SW7, SW8, SW9 and SW10 are set to be open; the working principle of the system in such status is exactly the same as in the second working status.

If the first working status is regarded as the normal status of power amplifiers, then the second, the third and the fourth statues are hot standby status. The power amplifier PA is the auxiliary amplifier of the power amplifiers PA1, PA2 and PA3 and does not belong to any sector. When a power amplifier of a sector fails, the SPDT microwave switches of the sector are switched so that auxiliary power amplifier PA can work in place of the failed power amplifier immediately without cutting off the system power or stopping the system operation, i.e., hot standby is achieved. Moreover, each of the four power amplifiers PA1, PA2, PA3 and PA amplifies signals of only one sector; therefore the sectors can be highly isolated.

Figure 10:
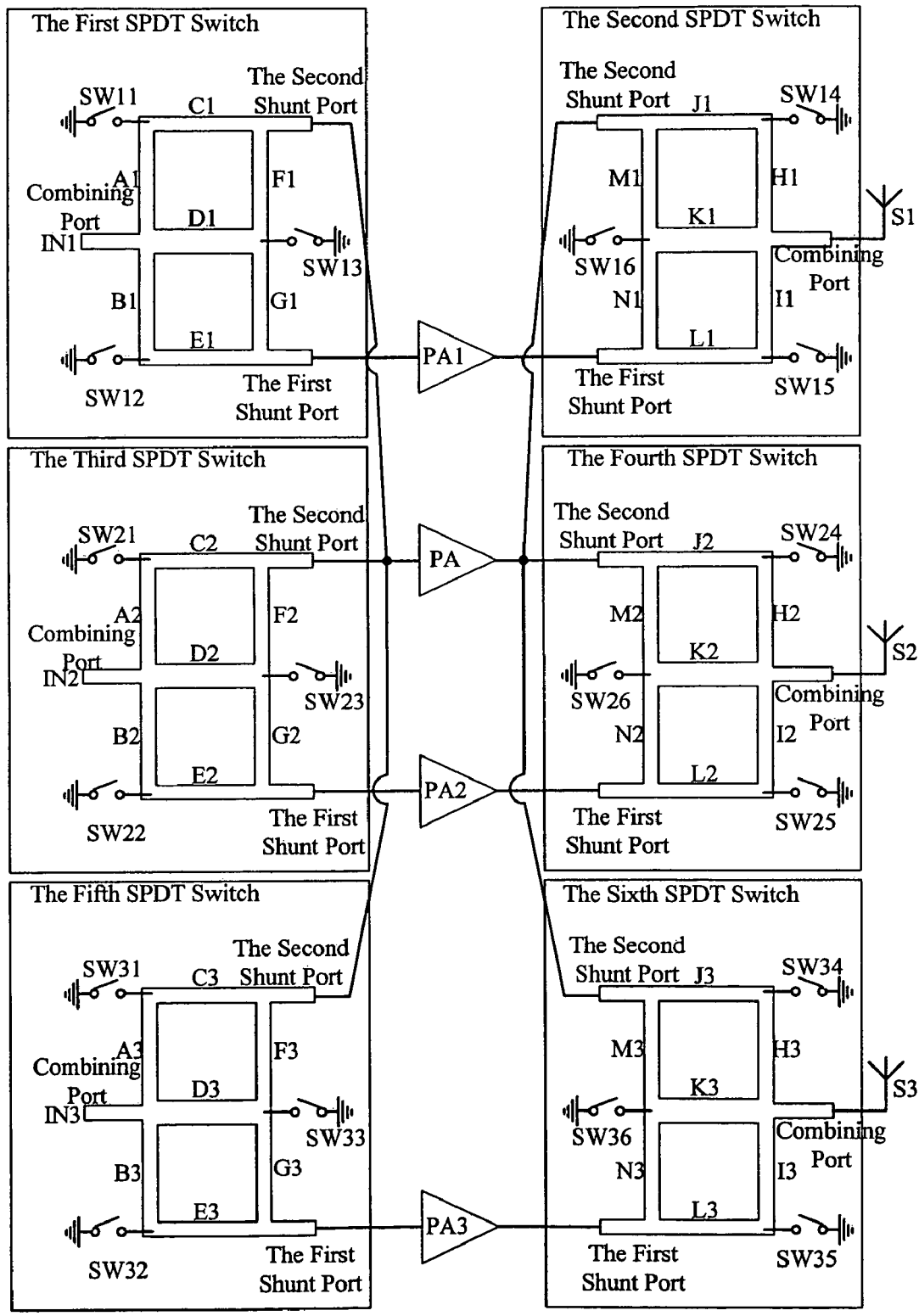
FIG. 10 is a schematic diagram illustrating the topology of the 'N+1' RF power amplifier hot standby system according to a fifth preferred embodiment of the present invention.

FIG. 10 is a schematic diagram illustrating the system topology of the 'N+1' RF power amplifier hot standby system according to a fifth preferred embodiment of the present invention. 3+1 hot standby for RF power amplifiers in a 3-sector application is achieved in this embodiment based on the working principle of the embodiment in FIG. 5.

The system shown in FIG. 10 includes six identical SPDT microwave switches from the first SPDT microwave switch to the sixth SPDT microwave switch, and four identical RF power amplifiers including PA1, PA2, PA3 and PA. The six SPDT microwave switches are identical with the SPDT microwave switches in the embodiment shown in FIG. 6; the power amplifiers PA1 to PA3 are the primary power amplifiers of three sectors respectively and PA is the auxiliary power amplifier.

As shown in FIG. 10, the combining port of the first SPDT microwave switch receives input signals of the first sector, the first shunt port of the first SPDT microwave switch is connected to the input port of PA1 and the second shunt port of the first SPDT microwave switch is connected to the input port of PA.

The first shunt port of the second SPDT microwave switch is connected to the output port of PA1, the second shunt port of the second SPDT microwave switch is connected to the output port of PA and the combining port of the second SPDT microwave switch is connected to Antenna S1 of the first sector.

The combining port of the third SPDT microwave switch receives input signals of the second sector, the first shunt port of the third SPDT microwave switch is connected to the input port of PA2 and the second shunt port of the third SPDT microwave switch is connected to the input port of PA.

The first shunt port of the fourth SPDT microwave switch is connected to the output port of PA2, the second shunt port of the fourth SPDT microwave switch is connected to the output port of PA and the combining port of the fourth SPDT microwave switch is connected to Antenna S2 of the second sector.

The combining port of the fifth SPDT microwave switch receives input signals of the third sector, the first shunt port of the fifth SPDT microwave switch is connected to the input port of PA3 and the second shunt port of the fifth SPDT microwave switch is connected to the input port of PA.

The first shunt port of the sixth SPDT microwave switch is connected to the output port of PA3, the second shunt port of the sixth SPDT microwave switch is connected to the output port of PA and the combining port of the sixth SPDT microwave switch is connected to Antenna S3 of the third sector.

Hot standby and power share for RF power amplifier are achieved in this embodiment through the switch device linkage between the first and the second SPDT microwave switches, the switch device linkage between the third and the fourth SPDT microwave switches and the switch device linkage between the fifth and the sixth SPDT microwave switches; the system has three working status accordingly.

In a first working status, PA1, PA2 and PA3 function properly and the auxiliary power amplifier PA does not work or is on standby.

In a second working status, when any of PA1, PA2 or PA3 fails, switches are switched so that the failed power amplifier is cut off from the system and the auxiliary power amplifier PA takes the place of the failed power amplifier. Such working status is regarded as standby status. For example, when power amplifier PA1 of the first sector fails, the SPDT microwave switches of the first sector are switched so that SW11, SW13, SW14 and SW16 are closed (shorted to ground), and SW12 and SW15 are open so that the auxiliary power amplifier PA functions in place of PA1.

In a third working status, PA1, PA2 and PA3 functions properly and the auxiliary power amplifier PA functions parallel to one of the three power amplifiers to increase the output power of the sector thereof. Such status is regarded as the 'power share' status. For example, the switches of the first and the third sectors are kept in the first working status of the system, the SPDT microwave switches in the second sector are switched so that SW21, SW22, SW24 and SW25 are closed (shorted to ground), SW23 and SW26 are open, i.e., PA2 and PA functions in parallel.

It can be seen from the description that in the 'N+1' hot standby and power share system for RF power amplifiers in this embodiment, every sector has a primary power amplifier and the whole system has an auxiliary power amplifier which belongs to none of the sectors; when one of the N power amplifiers fails, the auxiliary power amplifier can function in place of the failed power amplifier without cutting off the power or stopping the operation of the whole system, therefore hot standby is achieved. In normal situations, the auxiliary power amplifier can function for any of the sectors and increase the output power of the sector by 3 dB theoretically. Moreover, any of the four power amplifiers amplifies signals of only one sector, so the isolation between the sectors in this embodiment is independent of the consistency of power amplifiers. In normal situations, the isolation between sectors can be as high as 30 dB, which is inconsistent with respect to the solution in the prior art which adopts hybrid matrix. Furthermore, because the consistency of power amplifiers does not affect the isolation between sectors but only the combine power gain in power share status, the requirement on power amplifier match will be loose though matched power amplifiers are still needed, hence the modules are interchangeable to a great extent, which is also a notable advantage of the system compared with the solution in the prior art which adopts the hybrid matrix.

Figure 11:
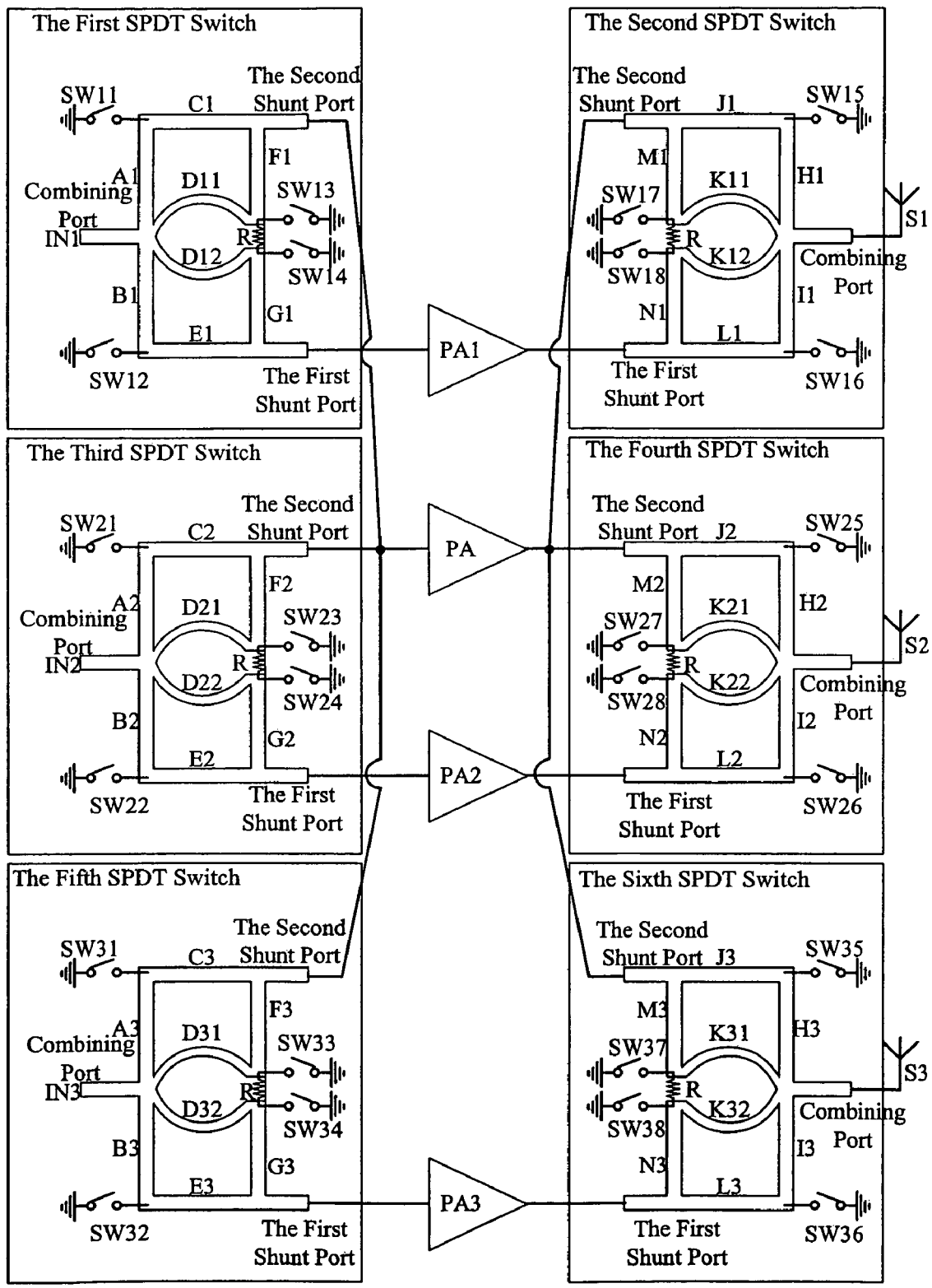
FIG. 11 is a schematic diagram illustrating the topology of the 'N+1' RF power amplifier hot standby system according to a sixth preferred embodiment of the present invention.

FIG. 11 is a schematic diagram illustrating the system topology of the 'N+1' RF power amplifier hot standby system according to a sixth preferred embodiment of the present invention. 3+1 hot standby for RF power amplifiers in a 3-sector application is achieved in this embodiment based on the working principle of the embodiment in FIG. 8.

The topology, working statuses and working process of the system in this embodiment are the same as the system shown in FIG. 10, the only difference is that the SPDT microwave switches adopted in this embodiment are the SPDT microwave switches shown in FIG. 8. Because there is a matching resistance installed between the shunt ports of each SPDT microwave switch which has functions of power dividing and power combining in the system, the matching resistance can provide the isolation function. When the input and output ports of a power amplifier are not match, reflected signals can not be transmitted to the input and output ports of another power amplifier, i.e., the working status of the another power amplifier will not be influenced, which improves the matching characteristics of input and output ports of the power amplifiers. Therefore the isolation between two power amplifiers in the power share status is much higher compared with that in the first 'N+1' RF power amplifier hot standby and power share system described in the fore-going descriptions.

It should be appreciated that those skilled in the art can produce equivalent replacement or alternative of the present invention without departing from the technical scheme and the theory thereof, thus any equivalent replacement or alternative of the present invention should be covered by the protection scope of the present invention.

The invention claimed is:

1. A hot standby system for radio frequency (RF) power amplifier, comprising: a primary RF power amplifier; an auxiliary RF power amplifier; and two single pole double throw (SPDT) microwave switches: a first SPDT microwave switch and a second SPDT microwave switch;

wherein the two SPDT microwave switches each comprises a combining port, a first shunt port and a second shunt port;

the combining port of the first SPDT microwave switch is a signal receiving end; the first shunt port of the first SPDT microwave switch is connected to the input port of the primary RF power amplifier; the second shunt port of the first SPDT microwave switch is connected to the input port of the auxiliary RF power amplifier;

the combining port of the second SPDT microwave switch is the signal export end; the first shunt port of the second SPDT microwave switch is connected to the output port of the primary RF power amplifier; the second shunt port of the second SPDT microwave switch is connected to the output port of the auxiliary RF power amplifier;

when the primary RF power amplifier functions properly, a signal inputted from the combining port of the first SPDT microwave switch is transmitted through the first shunt port of the first SPDT microwave switch to the input port of the primary RF power amplifier; after amplified by the primary RF power amplifier, the signal is transmitted to the first shunt port of the second SPDT microwave switch and then to the combining port of the second SPDT microwave switch;

when the primary RF power amplifier fails, a signal inputted from the combining port of the first SPDT microwave switch is transmitted through the second shunt port of the first SPDT microwave switch to the input port of the auxiliary RF power amplifier; after amplified by the auxiliary RF power amplifier, the signal is transmitted to the second shunt port of the second SPDT microwave switch and then to the combining port of the second SPDT microwave switch;

wherein the two SPDT microwave switches each further comprises seven transmission lines: a first, a second, a third, a fourth, a fifth, a sixth and a seventh transmission line and three switch devices: a first, a second and a third switch device; wherein the combining port of the first SPDT microwave switch is connected to the first ends of the fourth transmission line, the first transmission line and the second transmission line; the second end of the fourth transmission line is connected to the first ends of the sixth transmission line and the seventh transmission line, and the third switch device is installed between the ground and the junction of the fourth transmission line, the sixth transmission line and the seventh transmission line; the second end of the second transmission line is connected to the first end of the fifth transmission line, and the second switch device is installed between the ground and the junction of the second transmission line and the fifth transmission line; the second end of the fifth transmission line is connected to the second end of the seventh transmission line, and the junction of the fifth transmission line and the seventh transmission line is connected to the first shunt port; the second end of the first transmission line is connected to the first end of the third transmission line, and the first switch device is installed between the ground and the junction of the first transmission line and the third transmission line; the second end of the third transmission line is connected to the second end of the sixth transmission line, and the junction of the third transmission line and the sixth transmission line is connected to the second shunt port;

when a signal is inputted from the combining port, the first and the third switch devices are closed, and the second switch device is open, the input signal reaches the first shunt port through the second and the fifth transmission lines;

when a signal is inputted from the combining port, the second and the third switch devices are closed, and the first switch device is open, the input signal reaches the second shunt port through the first and the third transmission lines;

when a signal is inputted from the combining port, the first and the second switch devices are closed, and the third switch device is open, the input signal is divided into two signals after passing through the fourth transmission line, one of the two signals reaches the first shunt port through the seventh transmission line and the other signal reaches the second shunt port through the sixth transmission line;

when a signal is inputted from the first shunt port, the first and the third switch devices are closed, and the second switch device is open, the input signal reaches the combining port through the fifth and the second transmission lines;

when a signal is inputted from the second shunt port, the second and the third switch devices are closed, and the first switch device is open, the input signal reaches the combining port through the third and the first transmission lines;

when two signals are inputted from the first and the second shunt ports respectively, the first and the second switch devices are closed, and the third switch device is open, the two signals are combined at the junction of the seventh and the sixth transmission lines after passing through the seventh and the sixth transmission lines respectively, and the combined signal reaches the combining port through the fourth transmission line.

2. The hot standby system of claim 1, wherein the switch devices each in the two SPDT microwave switches is PIN diode.

3. The hot standby system of claim 1, wherein the seven transmission lines each is λ/4 length; the characteristic impedance of the first, second, third, fifth, sixth and seventh transmission lines each is Z0, and the characteristic impedance of the fourth transmission line is $$\frac{Z0}{\sqrt{2}}.$$

4. The hot standby system of claim 3, wherein the identical switch devices in the first and the second SPDT microwave switches are in linkage;

when the primary RF power amplifier functions properly, the first and the third switch devices of both the first and the second SPDT microwave switches are closed, the second device switches of both the first and the second SPDT microwave switches are open;

when the primary RF power amplifier and the auxiliary RF power amplifier operate in parallel, the first and the second switch devices of both the first and the second SPDT microwave switches are closed, the third device switches of both the first and the second SPDT microwave switches are open;

when the primary RF power amplifier fails, the second and the third switch devices of both the first and the second SPDT microwave switches are closed, the first device switches of both the first and the second SPDT microwave switches are open.

5. A hot standby method for radio frequency (RF) power amplifier, comprising:

when the primary RF power amplifier functions properly, setting the statuses of switch devices of the first and the second SPDT microwave switches to transmit a signal inputted from the combining port of the first SPDT microwave switch through the first shunt port of the first SPDT microwave switch to the input port of the primary RF power amplifier; amplify the signal by the primary RF power amplifier; transmit the amplified signal to the first shunt port of the second SPDT microwave switch and then to the combining port of the second SPDT microwave switch for export;

when the primary RF power amplifier fails, setting the statuses of switch devices of the first and the second SPDT microwave switches to transmit a signal inputted from the combining port of the first SPDT microwave switch through the second shunt port of the first SPDT microwave switch to the input port of the auxiliary RF power amplifier; amplify the signal by the auxiliary RF power amplifier; transmit the amplified signal to the second shunt port of the second SPDT microwave switch and then to the combining port of the second SPDT microwave switch for export;

wherein the first and the second SPDT microwave switches each further comprises eight transmission lines: a first, a second, a third, a fourth, a fifth, a sixth, a seventh and an eighth transmission line; and four switch devices: a first, a second, a third and a fourth switch device;

when the primary RF power amplifier functions properly, setting the first, the third and the fourth switch devices of the first and the second SPDT microwave switches to be closed, setting the second switch devices of the first and the second SPDT microwave switches to be open;

transmitting the signal inputted from the combining port of the first SPDT microwave switch to the first shunt port of the first SPDT microwave switch through the second and the fifth transmission lines, transmitting the signal to the primary RF power amplifier which amplifies the signal; transmitting the amplified signal to the first shunt port of the second SPDT microwave switch; transmitting the signal through the fifth and the second transmission lines of the second SPDT microwave switch to the combining port of the second SPDT microwave switch for export;

when one primary RF power amplifier and the auxiliary RF power amplifier operate in parallel, setting the first and the second switch devices of the first and the second SPDT microwave switches to be closed, setting the third and the fourth switch devices of the first and the second SPDT microwave switches to be open;

dividing the signal inputted from the combining port of the first SPDT microwave switch into a first signal and a second signal, transmitting the first signal through the eighth transmission line and the seventh transmission line to the first shunt port of the first SPDT microwave switch to be transmitted to the primary RF power amplifier; transmitting the second signal through the fourth transmission line and the sixth transmission line to the second shunt port of the first SPDT microwave switch to be transmitted to the auxiliary RF power amplifier; amplifying the first signal and the second signal respectively by the primary RF power amplifier and the auxiliary RF power amplifier and transmitting the first signal and the second signal to the first and the second shunt ports of the second SPDT microwave switch respectively; transmitting the amplified first signal through the seventh transmission line and the eighth transmission line, transmitting the amplified second signal through the sixth transmission line and the fourth transmission line; combining the first signal and the second signal into one signal to the combining port of the second SPDT microwave switch for export; and when the primary RF power amplifier fails, setting the first, the second, the third and the fourth switch devices of the first and the second SPDT microwave switches to be closed, setting the first switch devices of the first and the second SPDT microwave switches to be open;

transmitting the signal inputted from the combining port of the first SPDT microwave switch to the second shunt port of the first SPDT microwave switch through the first and the third transmission lines, transmitting the signal to the auxiliary RF power amplifier which amplifies the signal; transmitting the amplified signal to the second shunt port of the second SPDT microwave switch, transmitting the signal through the third and the first transmission lines of the second SPDT microwave switch to the combining port of the second SPDT microwave switch for export.

6. A hot standby system for radio frequency (RF) power amplifier, comprising: a primary RF power amplifier; an auxiliary RF power amplifier; and two single pole double throw (SPDT) microwave switches: a first SPDT microwave switch and a second SPDT microwave switch;

wherein the two SPDT microwave switches each comprises a combining port, a first shunt port and a second shunt port;

the combining port of the first SPDT microwave switch is a signal receiving end; the first shunt port of the first SPDT microwave switch is connected to the input port of the primary RF power amplifier; the second shunt port of the first SPDT microwave switch is connected to the input port of the auxiliary RF power amplifier;

the combining port of the second SPDT microwave switch is the signal export end; the first shunt port of the second SPDT microwave switch is connected to the output port of the primary RF power amplifier; the second shunt port of the second SPDT microwave switch is connected to the output port of the auxiliary RF power amplifier;

when the primary RF power amplifier functions properly, a signal inputted from the combining port of the first SPDT microwave switch is transmitted through the first shunt port of the first SPDT microwave switch to the input port of the primary RF power amplifier; after amplified by the primary RF power amplifier, the signal is transmitted to the first shunt port of the second SPDT microwave switch and then to the combining port of the second SPDT microwave switch;

when the primary RF power amplifier fails, a signal inputted from the combining port of the first SPDT microwave switch is transmitted through the second shunt port of the first SPDT microwave switch to the input port of the auxiliary RF power amplifier; after amplified by the auxiliary RF power amplifier, the signal is transmitted to the second shunt port of the second SPDT microwave switch and then to the combining port of the second SPDT microwave switch;

wherein the two SPDT microwave switches each further comprises eight transmission lines: a first, a second, a third, a fourth, a fifth, a sixth, a seventh and an eighth transmission line; and four switch devices: a first, a second, a third and a fourth switch device; wherein the combining port of the first SPDT microwave switch is connected to the first ends of the first transmission line, the second transmission line, the fourth transmission line and the eighth transmission line; the second end of the fourth transmission line is connected to the first end of the sixth transmission line, and the third switch device is installed between the ground and the junction of and the fourth transmission line and the sixth transmission line; the second end of the eighth transmission line is connected to the first end of the seventh transmission line, and the fourth switch device is installed between the ground and the junction of the eighth transmission line and the seventh transmission line; a matching resistance R is installed between the second end of the fourth transmission line and the second end of the eighth transmission line; the second end of the first transmission line is connected to the first end of the third transmission line, and the first switch device is installed between the ground and the junction of the first transmission line and the third transmission line; the second end of the second transmission line is connected to the first end of the fifth transmission line, and the second switch device is installed between the ground and the junction of the second transmission line and the fifth transmission line; the second end of the fifth transmission line is connected to the second end of the seventh transmission line, and the junction of the fifth transmission line and the seventh transmission line is connected to the first shunt port; the second end of the third transmission line is connected to the second end of the sixth transmission line, and the junction of the third transmission line and the sixth transmission line is connected to the second shunt port;

when a signal is inputted from the combining port, the first, the third and the fourth switch devices are closed, and the second switch device is open, the input signal reaches the first shunt port through the second and the fifth transmission lines;

when a signal is inputted from the combining port, the second, the third and the fourth switch devices are closed, and the first switch device is open, the input signal reaches the second shunt port through the first and the third transmission lines;

when a signal is inputted from the combining port, the first and the second switch devices are closed, and the third and the fourth switch devices are open, the input signal is divided into two signals, one of the two signals reaches the first shunt port through the eighth transmission line and the seventh transmission line and the other signal reaches the second shunt port through the fourth transmission line and the sixth transmission line;

when a signal is inputted from the first shunt port, the first, the third and the fourth switch devices are closed, and the second switch device is open, the input signal reaches the combining port through the fifth and the second transmission lines;

when a signal is inputted from the second shunt port, the second, the third and the fourth switch devices are closed, and the first switch device is open, the input signal reaches the combining port through the first and the third transmission lines;

when two signals are inputted from the first and the second shunt ports respectively, the first and the second switch devices are closed, and the third and the fourth switch devices are open, one of the two signals reaches the combining port through the sixth transmission line and the fourth transmission line and the other signal reaches the combining port through the seventh transmission line and the eighth transmission line.

7. The hot standby system of claim 6, wherein the eight transmission lines each is λ4 length; the characteristic impedance of the first, second, third, fifth, sixth and seventh transmission lines each is Z0, the characteristic impedance of the fourth transmission line and the eighth transmission line is $\sqrt{2}Z0$, and the resistance value of the matching resistance is 2Z0.

8. The hot standby system of claim 6, wherein identical switch devices in the first and the second SPDT microwave switches are in linkage;

when the primary RF power amplifier functions properly, the first, the third and the fourth switch devices of both the first and the second SPDT microwave switches are closed, the second device switches of both the first and the second SPDT microwave switches are open;

when the primary RF power amplifier and the auxiliary RF power amplifier operate in parallel, the first and the second switch devices of both the first and the second SPDT microwave switches are closed, the third and the fourth device switches of both the first and the second SPDT microwave switches are open;

when the primary RF power amplifier fails, the second, the third switch and the fourth devices of both the first and the second SPDT microwave switches are closed, the first device switches of both the first and the second SPDT microwave switches are open.

9. The hot standby system of claim 6, wherein the switch devices each in the two SPDT microwave switches is PIN diode.

10. A single pole double throw (SPDT) microwave switch, comprising: a combining port, a first shunt port, a second shunt port, seven transmission lines: a first, a second, a third, a fourth, a fifth, a sixth and a seventh transmission line and three switch devices: a first, a second and a third switch device; wherein the combining port of the SPDT microwave switch is connected to the first ends of the fourth transmission line, the first transmission line and the second transmission line; the second end of the fourth transmission line is connected to the first ends of the sixth transmission line and the seventh transmission line, and the third switch device is installed between the ground and the junction of the fourth transmission line, the sixth transmission line and the seventh transmission line; the second end of the second transmission line is connected to the first end of the fifth transmission line, and the second switch device is installed between the ground and the junction of the second transmission line and the fifth transmission line; the second end of the fifth transmission line is connected to the second end of the seventh transmission line, and the junction of the fifth transmission line and the seventh transmission line is connected to the first shunt port; the second end of the first transmission line is connected to the first end of the third transmission line, and the first switch device is installed between the ground and the junction of the first transmission line and the third transmission line; the second end of the third transmission line is connected to the second end of the sixth transmission line, and the junction of the third transmission line and the sixth transmission line is connected to the second shunt port;

when a signal is inputted from the combining port, the first and the third switch devices are closed, and the second switch device is open, the input signal reaches the first shunt port through the second and the fifth transmission lines;

when a signal is inputted from the combining port, the second and the third switch devices are closed, and the first switch device is open, the input signal reaches the second shunt port through the first and the third transmission lines;

when a signal is inputted from the combining port, the first and the second switch devices are closed, and the third switch device is open, the input signal is divided into two signals after passing through the fourth transmission line, one of the two signals reaches the first shunt port through the seventh transmission line and the other signal reaches the second shunt port through the sixth transmission line;

when a signal is inputted from the first shunt port, the first and the third switch devices are closed, and the second switch device is open, the input signal reaches the combining port through the fifth and the second transmission lines;

when a signal is inputted from the second shunt port, the second and the third switch devices are closed, and the first switch device is open, the input signal reaches the combining port through the third and the first transmission lines;

when two signals are inputted from the first and the second shunt ports respectively, the first and the second switch devices are closed, and the third switch device is open, the two signals are combined at the junction of the seventh and the sixth transmission lines after passing through the seventh and the sixth transmission lines respectively, and the combined signal reaches the combining port through the fourth transmission line.

11. The SPDT microwave switch of claim 10, wherein the seven transmission lines each is λ/4 length; the characteristic impedance of the first, second, third, fifth, sixth and seventh transmission lines is Z0, and the characteristic impedance of the fourth transmission line is $$\frac{Z0}{\sqrt{2}}.$$

12. A single pole double throw (SPDT) microwave switch, comprising: a combining port, a first shunt port, a second shunt port, eight transmission lines: a first, a second, a third, a fourth, a fifth, a sixth, a seventh and an eighth transmission line; and four switch devices: a first, a second, a third and a fourth switch device; wherein;

the combining port of the SPDT microwave switch is connected to the first ends of the first transmission line, the second transmission line, the fourth transmission line and the eighth transmission line; the second end of the fourth a transmission line is connected to the first end of the sixth transmission line, and the third switch device is installed between the ground and the junction of and the fourth transmission line and the sixth transmission line; the second end of the eighth transmission line is connected to the first end of the seventh transmission line, and the fourth switch device is installed between the ground and the junction of the eighth transmission line and the seventh transmission line; a matching resistance R is installed between the second end of the fourth transmission line and the second end of the eighth transmission line; the second end of the first transmission line is connected to the first end of the third transmission line, and the first switch device is installed between the ground and the junction of the first transmission line and the third transmission line; the second end of the second transmission line is connected to the first end of the fifth transmission line, and the second switch device is installed between the ground and the junction of the second transmission line and the fifth transmission line; the second end of the fifth transmission line is connected to the second end of the seventh transmission line, and the junction of the fifth transmission line and the seventh transmission line is connected to the first shunt port; the second end of the third transmission line is connected to the second end of the sixth transmission line, and the junction of the third transmission line and the sixth transmission line is connected to the second shunt port;

when a signal is inputted from the combining port, the first, the third and the fourth switch devices are closed, and the second switch device is open, the input signal reaches the first shunt port through the second and the fifth transmission lines;

when a signal is inputted from the combining port, the second, the third and the fourth switch devices are closed, and the first switch device is open, the input signal reaches the second shunt port through the first and the third transmission lines;

when a signal is inputted from the combining port, the first and the second switch devices are closed, and the third and the fourth switch devices are open, the input signal is divided into two signals, one of the two signals reaches the first shunt port through the eighth transmission line and the seventh transmission line and the other signal reaches the second shunt port through the fourth transmission line and the sixth transmission line;

when a signal is inputted from the first shunt port, the first, the third and the fourth switch devices are closed, and the second switch device is open, the input signal reaches the combining port through the fifth and the second transmission lines;

when a signal is inputted from the second shunt port, the second, the third and the fourth switch devices are closed, and the first switch device is open, the input signal reaches the combining port through the first and the third transmission lines;

when two signals are inputted from the first and the second shunt ports respectively, the first and the second switch devices are closed, and the third and the fourth switch devices are open, one of the two signals reaches the combining port through the sixth transmission line and the fourth transmission line and the other signal reaches the combining port through the seventh transmission line and the eighth transmission line.

13. The SPDT microwave switch of claim 12, wherein the eight transmission lines each is $\lambda/4$ length; the characteristic impedance of the first, second, third, fifth, sixth and seventh transmission lines is $Z0$, the characteristic impedance of the fourth transmission line and the eighth transmission line is $\sqrt{2}Z0$, and the resistance of the matching resistance is $2Z0$.

14. A hot standby system for radio frequency (RF) power amplifier, comprising: an auxiliary RF power amplifier; N primary RF power amplifiers; and 2N single pole double throw (SPDT) microwave switches; wherein N is a natural number;

N SPDT microwave switches are installed at the input sides of the N primary RF power amplifiers; and the other N SPDT microwave switches are installed at the output sides of the N primary RF power amplifiers; and the 2N SPDT microwave switches each comprises a combining port, a first shunt port and a second shunt port;

the combining port of each of the N SPDT microwave switches installed at the input sides of the primary RF power amplifiers is a signal receiving end; the first shunt port of each of the N SPDT microwave switches installed at the input sides of the primary RF power amplifiers is connected to the input port of the primary RF power amplifiers, the second shunt port of each of the N SPDT microwave switches installed at the input sides of the primary RF power amplifiers is connected to the input port of the auxiliary RF power amplifier;

the combining port of each of the N SPDT microwave switches installed at the output sides of the primary RF power amplifiers is a signal export end, the first shunt port of each of the N SPDT microwave switches installed at the output sides of the primary RF power amplifiers is connected to the output port of the primary RF power amplifiers, the second shunt port of each of the N SPDT microwave switches installed at the output sides of the primary RF power amplifiers is connected to the output port of the auxiliary RF power amplifier;

when a primary RF power amplifier functions properly, a signal inputted from the combining port of a SPDT microwave switch installed at the input side of the primary RF power amplifier is transmitted through the first shunt port of the SPDT microwave switch installed at the input side of the primary RF power amplifier to the input port of the primary RF power amplifier; after amplified by the primary RF power amplifier, the signal is transmitted to the first shunt port of a SPDT microwave switch installed at the output side of the primary RF power amplifier and then to the combining port of the SPDT microwave switch installed at the output side of the primary RF power amplifier;

when one primary RF power amplifier fails, a signal inputted from the combining port of a SPDT microwave switch installed at the input side of the one primary RF power amplifier is transmitted through the second shunt port of the SPDT microwave switch installed at the input side of the one primary RF power amplifier to the input port of the auxiliary RF power amplifier; after amplified by the auxiliary RF power amplifier, the signal is transmitted to the second shunt port of a SPDT microwave switch installed at the output side of the one primary RF power amplifier and then to the combining port of the SPDT microwave switch installed at the output side of the one primary RF power amplifier;

wherein the SPDT microwave switches each further comprises seven transmission lines: a first, a second, a third, a fourth, a fifth, a sixth and a seventh transmission line and three switch devices: a first, a second and a third switch device; wherein the combining port of the SPDT microwave switch is connected to the first ends of the fourth transmission line, the first transmission line and the second transmission line; the second end of the fourth transmission line is connected to the first ends of the sixth transmission line and the seventh transmission line, and the third switch device is installed between the ground and the junction of the fourth transmission line, the sixth transmission line and the seventh transmission line; the second end of the second transmission line is connected to the first end of the fifth transmission line, and the second switch device is installed between the ground and the junction of the second transmission line and the fifth transmission line; the second end of the fifth transmission line is connected to the second end of the seventh transmission line, and the junction of the fifth transmission line and the seventh transmission line is connected to the first shunt port; the second end of the first transmission line is connected to the first end of the third transmission line, and the first switch device is installed between the ground and the junction of the first transmission line and the third transmission line; the second end of the third transmission line is connected to the second end of the sixth transmission line, and the junction of the third transmission line and the sixth transmission line is connected to the second shunt port;

when a signal is inputted from the combining port, the first and the third switch devices are closed, and the second switch device is open, the input signal reaches the first shunt port through the second and the fifth transmission lines;

when a signal is inputted from the combining port, the second and the third switch devices are closed, and the first switch device is open, the input signal reaches the second shunt port through the first and the third transmission lines;

when a signal is inputted from the combining port, the first and the second switch devices are closed, and the third switch device is open, the input signal is divided into two signals after passing through the fourth transmission line, one of the two signals reaches the first shunt port through the seventh transmission line and the other signal reaches the second shunt port through the sixth transmission line;

when a signal is inputted from the first shunt port, the first and the third switch devices are closed, and the second switch device is open, the input signal reaches the combining port through the fifth and the second transmission lines;

when a signal is inputted from the second shunt port, the second and the third switch devices are closed, and the first switch device is open, the input signal reaches the combining port through the third and the first transmission lines;

when two signals are inputted from the first and the second shunt ports respectively, the first and the second switch devices are closed, and the third switch device is open, the two signals are combined at the junction of the seventh and the sixth transmission lines after passing through the seventh and the sixth transmission lines respectively, and the combined signal reaches the combining port through the fourth transmission line.

15. The hot standby system of claim 14, wherein identical switch devices in the SPDT microwave switches installed at the input and output sides of the primary RF power amplifiers are in linkage;

when a primary RF power amplifier functions properly, the first and the third switch devices of the SPDT microwave switches installed at the input and the output sides of the primary RF power amplifier are closed, the second switch devices of the SPDT microwave switches installed at the input and the output sides of the primary RF power amplifier are open;

when one primary RF power amplifier and the auxiliary RF power amplifier operate in parallel, the first and the second switch devices of the SPDT microwave switches installed at the input and the output sides of the one primary RF power amplifier are closed, the third switch devices of the SPDT microwave switches installed at the input and the output sides of the one primary RF power amplifier are open;

when one primary RF power amplifier fails, the second and the third switch devices of the SPDT microwave switches installed at the input and the output sides of the primary RF power amplifier are closed, and the first switch devices of the SPDT microwave switches installed at the input and the output port sides of the primary RF power amplifier are open.

16. The hot standby system of claim 14, wherein the seven transmission lines each is $\lambda/4$ length; the characteristic impedance of the first, second, third, fifth, sixth and seventh transmission lines is $Z0$, and the characteristic impedance of the fourth transmission line is $$\frac{Z0}{\sqrt{2}}.$$

17. A hot standby method for radio frequency (RF) power amplifier, comprising:

when a primary RF power amplifier function properly, setting the status of the switch devices of the SPDT microwave switches installed at the input and output sides of the primary RF power amplifier to transmit a signal inputted from the combining port of the SPDT microwave switch installed at the input side of the primary RF power amplifier through the first shunt port of the SPDT microwave switch installed at the input side of the primary RF power amplifier to the input port of the primary RF power amplifier; amplify the signal by the primary RF power amplifier, and transmit the amplified signal to the first shunt port of the SPDT microwave switch installed at the output side of the primary RF power amplifier and then to the combining port of the SPDT microwave switch installed at the output side of the primary RF power amplifier for export;

when one primary RF power amplifier fails, setting the status of the switch devices of the SPDT microwave switches installed at the input and output sides of the one primary RF power amplifier to transmit a signal inputted from the combining port of the SPDT microwave switch installed at the input side of the one primary RF power amplifier through the second shunt port of the SPDT microwave switch installed at the input side of the one primary RF power amplifier to the input port of the auxiliary RF power amplifier; amplify the signal by the auxiliary RF power amplifier, and transmit the amplified signal to the second shunt port of the SPDT microwave switch installed at the output side of the one primary RF power amplifier and then to the combining port of the SPDT microwave switch installed at the output side of the one primary RF power amplifier for export;

wherein the SPDT microwave switches each comprises seven transmission lines: a first, a second, a third, a fourth, a fifth, a sixth and a seventh transmission line and three switch devices: a first, a second and a third switch device;

when a primary RF power amplifier function properly, setting the first and the third switch devices of the SPDT microwave switches installed at the input and output sides of the primary RF power amplifier to be closed, setting the second switch devices of the SPDT microwave switches installed at the input and output sides of the primary RF power amplifier to be open;

transmitting the signal inputted from the combining port to the first shunt port through the second and the fifth transmission lines of the SPDT microwave switch installed at the input side of the primary RF power amplifier, transmitting the signal to the primary RF power amplifier which amplifies the signal;

transmitting the amplified signal to the first shunt port of the SPDT microwave switch installed at the output side of the primary RF power amplifier, transmitting the signal through the fifth and the second transmission lines of the SPDT microwave switch installed at the output side of the primary RF power amplifier to the combining port of the SPDT microwave switch installed at the output side of the primary RF power amplifier for export;

when one primary RF power amplifier and the auxiliary RF power amplifier operate in parallel.

setting the first and the second switch devices of the SPDT microwave switches installed at the input and output sides of the one primary RF power amplifier to be closed, setting the third switch devices of the SPDT microwave switches installed at the input and output sides of the one primary RF power amplifier to be open;

transmitting the signal inputted from the combining port of the SPDT microwave switch installed at the input side of the one primary RF power amplifier through the fourth transmission line, dividing the signal into a first signal and a second signal, transmitting the first signal through the seventh transmission line to the first shunt port of the SPDT microwave switch installed at the input side of the one primary RF power amplifier, and transmitting the first signal to the one primary RF power amplifier which amplifies the signal;

transmitting the amplified first signal to the first shunt port of the SPDT microwave switch installed at the output side of the one primary RF power amplifier, transmitting the amplified first signal through the seventh transmission line of the SPDT microwave switch installed at the output side of the one primary RF power amplifier; transmitting the second signal through the sixth transmission line to the second shunt port of the SPDT microwave switch installed at the input side of the one primary RF power amplifier, and transmitting the second signal to the auxiliary RF power amplifier which amplifies the signal;

transmitting the amplified second signal to the second shunt port of the SPDT microwave switch installed at the output side of the one primary RF power amplifier, transmitting the amplified second signal through the sixth transmission line of the SPDT microwave switch installed at the output side of the one primary RF power amplifier; combining the amplified first signal and the amplified second signal into one signal at the junction of the seventh and the sixth transmission lines of the SPDT microwave switch installed at the output side of the one primary RF power amplifier, and transmitting the combined signal through the fourth transmission line to the combining port of the SPDT microwave switch installed at the output side of the one primary RF power amplifier for export; and when one primary RF power amplifier fails, setting the second and the third switch devices of the SPDT microwave switches installed at the input and output sides of the one primary RF power amplifier to be closed, setting the first switch devices of the SPDT microwave switches installed at the input and output sides of the one primary RF power amplifier to be open;

transmitting the signal inputted from the combining port to the second shunt port through the first and the third transmission lines of the SPDT microwave switch installed at the input side of the one primary RF power amplifier, transmitting the signal to the auxiliary RF power amplifier which amplifies the signal; transmitting the amplified signal to the second shunt port of the SPDT microwave switch installed at the output side of the one primary RF power amplifier, transmitting the amplified signal through the third and the first transmission lines to the combining port of the SPDT microwave switch installed at the output side of the one primary RF power amplifier for export.

18. A hot standby system for radio frequency (RF) power amplifier, comprising: an auxiliary RF power amplifier; N primary RF power amplifiers; and .2N single pole double throw (SPDT) microwave switches; wherein N is a natural number;

N SPDT microwave switches are installed at the input sides of the N primary RF power amplifiers; and the other N SPDT microwave switches are installed at the output sides of the N primary RF power amplifiers; and the 2N SPDT microwave switches each comprises a combining port, a first shunt port and a second shunt port;

the combining port of each of the N SPDT microwave switches installed at the input sides of the primary RF power amplifiers is a signal receiving end; the first shunt port of each of the N SPDT microwave switches installed at the input sides of the primary RF power amplifiers is connected to the input port of the primary RF power amplifiers, the second shunt port of each of the N SPDT microwave switches installed at the input sides of the primary RF power amplifiers is connected to the input port of the auxiliary RF power amplifier;

the combining port of each of the N SPDT microwave switches installed at the output sides of the primary RF power amplifiers is a signal export end, the first shunt port of each of the N SPDT microwave switches installed at the output sides of the primary RF power amplifiers is connected to the output port of the primary RF power amplifiers, the second shunt port of each of the N SPDT microwave switches installed at the output sides of the primary RF power amplifiers is connected to the output port of the auxiliary RF power amplifier;

when a primary RF power amplifier functions properly, a signal inputted from the combining port of a SPDT microwave switch installed at the input side of the primary RF power amplifier is transmitted through the first shunt port of the SPDT microwave switch installed at the input side of the primary RF power amplifier to the input port of the primary RF power amplifier; after amplified by the primary RF power amplifier, the signal is transmitted to the first shunt port of a SPDT microwave switch installed at the output side of the primary RF power amplifier and then to the combining port of the SPDT microwave switch installed at the output side of the primary RF power amplifier;

when one primary RF power amplifier fails, a signal inputted from the combining port of a SPDT microwave switch installed at the input side of the one primary RF power amplifier is transmitted through the second shunt port of the SPDT microwave switch installed at the input side of the one primary RF power amplifier to the input port of the auxiliary RF power amplifier; after amplified by the auxiliary RF power amplifier, the signal is transmitted to the second shunt port of a SPDT microwave switch installed at the output side of the one primary RF power amplifier and then to the combining port of the SPDT microwave switch installed at the output side of the one primary RF power amplifier;

wherein the SPDT microwave switches each further comprises eight transmission lines: a first, a second, a third, a fourth, a fifth, a sixth, a seventh and an eighth transmission line; and four switch devices: a first, a second, a third and a fourth switch device; wherein the combining port of the SPDT microwave switch is connected to the first ends of the first transmission line, the second transmission line, the fourth transmission line and the eighth transmission line; the second end of the fourth transmission line is connected to the first end of the sixth transmission line, and the third switch device is installed between the ground and the junction of and the fourth transmission line and the sixth transmission line; the second end of the eighth transmission line is connected to the first end of the seventh transmission line, and the fourth switch device is installed between the ground and the junction of the fourth b transmission line and the seventh transmission line; a matching resistance R is installed between the second end of the fourth transmission line and the second end of the eighth transmission line; the second end of the first transmission line is connected to the first end of the third transmission line, and the first switch device is installed between the ground and the junction of the first transmission line and the third transmission line; the second end of the second transmission line is connected to the first end of the fifth transmission line, and the second switch device is installed between the ground and the junction of the second transmission line and the fifth transmission line; the second end of the fifth transmission line is connected to the second end of the seventh transmission line, and the junction of the fifth transmission line and the seventh transmission line is connected to the first shunt port; the second end of the third transmission line is connected to the second end of the sixth transmission line, and the junction of the third transmission line and the sixth transmission line is connected to the second shunt port;

when a signal is inputted from the combining port, the first, the third and the fourth switch devices are closed, and the second switch device is open, the input signal reaches the first shunt port through the second and the fifth transmission lines;

when a signal is inputted from the combining port, the second, the third and the fourth switch devices are closed, and the first switch device is open, the input signal reaches the second shunt port through the first and the third transmission lines;

when a signal is inputted from the combining port, the first and the second switch devices are closed, and the third and the fourth switch devices are open, the input signal is divided into two signals, one of the two signals reaches the first shunt port through the eighth transmission line and the seventh transmission line and the other signal reaches the second shunt port through the fourth transmission line and the sixth transmission line;

when a signal is inputted from the first shunt port, the first, the third and the fourth switch devices are closed, and the second switch device is open, the input signal reaches the combining port through the fifth and the second transmission lines;

when a signal is inputted from the second shunt port, the second, the third and the fourth switch devices are closed, and the first switch device is open, the input signal reaches the combining port through the first and the third transmission lines;

when two signals are inputted from the first and the second shunt ports respectively, the first and the second switch devices are closed, and the third and the fourth switch devices are open, one of the two signals reaches the combining port through the sixth transmission line and the fourth transmission line and the other signal reaches the combining port through the seventh transmission line and the eighth transmission line.

19. The hot standby system of claim 18, wherein the eight transmission lines each is $\lambda/4$ length; the characteristic impedance of the first, second, third, fifth, sixth and seventh transmission lines is Z0, the characteristic impedance of the fourth transmission line and the eighth transmission line is $\sqrt{2}Z0$, and the resistance of the matching resistance is 2Z0.

20. The hot standby system of claim 18, wherein identical switch devices in the SPDT microwave switches installed at the input and output sides of the primary RF power amplifiers are in linkage;

when a primary RF power amplifier functions properly, the first, the third and the fourth switch devices of the SPDT microwave switches installed at the input and the output sides of the primary RF power amplifier are closed, the second switch devices of the SPDT microwave switches installed at the input and the output sides of the primary RF power amplifier are open;

when one primary RF power amplifier and the auxiliary RF power amplifier operate in parallel, the first and the second switch devices of the SPDT microwave switches installed at the input and the output sides of the one primary RF power amplifier are closed, the third and the fourth switch devices of the SPDT microwave switches installed at the input and the output sides of the one primary RF power amplifier are open;

when one primary RF power amplifier fails, the second, the third and the fourth switch devices of the SPDT microwave switches installed at the input and the output sides of the one primary RF power amplifier are closed, and the first switch devices of the SPDT microwave switches installed at the input and the output sides of the one primary RF power amplifier are open.

21. A hot standby method for radio frequency (RF) power amplifier, comprising:

when the primary RF power amplifier functions properly, setting the statuses of switch devices of the first and the second SPDT microwave switches to transmit a signal inputted from the combining port of the first SPDT microwave switch through the first shunt port of the first SPDT microwave switch to the input port of the primary RF power amplifier; amplify the signal by the primary RF power amplifier; transmit the amplified signal to the first shunt port of the second SPDT microwave switch and then to the combining port of the second SPDT microwave switch for export;

when the primary RF power amplifier fails, setting the statuses of switch devices of the first and the second SPDT microwave switches to transmit a signal inputted from the combining port of the first SPDT microwave switch through the second shunt port of the first SPDT microwave switch to the input port of the auxiliary RF power amplifier; amplify the signal by the auxiliary RF power amplifier; transmit the amplified signal to the second shunt port of the second SPDT microwave switch and then to the combining port of the second SPDT microwave switch for export;

wherein the first and the second SPDT microwave switches each further comprises seven transmission lines: a first, a second, a third, a fourth, a fifth, a sixth and a seventh transmission line and three switch devices: a first, a second and a third switch device;

when the primary RF power amplifier functions properly, setting the first and the third switch devices of the first and the second SPDT microwave switches to be closed, and setting the second switch devices of the first and the second SPDT microwave switches to be open;

transmitting the signal inputted from the combining port of the first SPDT microwave switch to the first shunt port of the first SPDT microwave switch through the second and the fifth transmission lines of the first SPDT microwave switch, and transmitting the signal to the primary RF power amplifier which amplifies the signal; transmitting the amplified signal to the first shunt port of the second SPDT microwave switch, and transmitting the amplified signal through the fifth and the second transmission lines of the second SPDT microwave switch to the combining port of the second SPDT microwave switch;

when the primary RF power amplifier and the auxiliary RF power amplifier operate in parallel, setting the first and the second switch devices of the first and the second SPDT microwave switches to be closed, and setting the third switch devices of the first and the second SPDT microwave switches to be open;

transmitting the signal inputted from the combining port of the first SPDT microwave switch through the fourth transmission line, dividing the signal into a first signal and a second signal; transmitting the first signal to the first shunt port through the seventh transmission line, transmitting the first signal to the primary RF power amplifier which amplifies the first signal; transmitting the amplified first signal to the first shunt port of the second SPDT microwave switch, and transmitting through the seventh transmission line of the second SPDT microwave switch; transmitting the second signal to the second shunt port through the sixth transmission line, transmitting the second signal to the auxiliary RF power amplifier which amplifies the second signal; and transmitting the amplified second signal to the second shunt port of the second SPDT microwave switch, and transmitting through the sixth transmission line of the second SPDT microwave switch; combining the amplified first signal and the amplified second signal into one signal in the junction of the seven and the sixth transmission lines of the second SPDT microwave switch, and transmitting through the fourth transmission line to the combining port of the second SPDT microwave switch for export; and when the primary RF power amplifier fails, setting the second and the third switch devices of the first and the second SPDT microwave switches to be closed, and setting the first switch devices of the first and the second SPDT microwave switches to be open;

transmitting the signal inputted from the combining port of the first SPDT microwave switch to the second shunt port of the first SPDT microwave switch through the first and the third transmission lines, transmitting the signal to the auxiliary RF power amplifier which amplifies the signal; transmitting the amplified signal to the second shunt port of the second SPDT microwave switch, transmitting the signal through the third and the first transmission lines of the second SPDT microwave switch to the combining port of the second SPDT microwave switch for export.

22. A hot standby system for radio frequency (RF) power amplifier, comprising: a primary RF power amplifier, an auxiliary RF power amplifier, a first microwave switch, and a second microwave switch; wherein the first and the second microwave switches each comprises: a combining port, a first shunt port and a second shunt port;

the combining port of the first microwave switch is a signal receiving end; the first shunt port of the first microwave switch is connected to the input port of the primary RF power amplifier; and the second shunt port of the first microwave switch is connected to the input port of the auxiliary RF power amplifier;

the combining port of the second microwave switch is a signal export end; the first shunt port of the second microwave switch is connected to the output port of the primary RF power amplifier; and the second shunt port of the second microwave switch is connected to the output port of the auxiliary RF power amplifier;

the first and the second microwave switches each further comprises: a first transmission line, a second transmission line, a third transmission line, a fourth transmission line, a first switch device, a second switch device, a third switch device, and a power dividing/combining component; wherein the power dividing/combining component comprises a combining port, a tri-line junction, a first shunt port and a second shunt port;

the combining port of the microwave switch is connected to the first shunt port of the microwave switch through the first transmission line and the second transmission line; the junction of the first transmission line and the second transmission line is connected to ground through the first switch device;

the combining port of the microwave switch is further connected to the second shunt port of the microwave switch through the third transmission line and the fourth transmission line; the junction of the third transmission line and the fourth transmission line is connected to ground through the second switch device;

the combining port of the power dividing/combining component is connected to the junction of the first transmission line and the third transmission line; the first shunt port of the power dividing/combining component is connected to the first shunt port of the microwave switch device; the second shunt port of the power dividing/combining component is connected to the second shunt port of the microwave switch device; the tri-line junction of the power dividing/combining component is connected to ground through the third switch device.

23. The hot standby system of claim 22, wherein the power dividing/combining component further comprises a fifth transmission line, a sixth transmission line, a seventh transmission line, an eighth transmission line and a matching resistance; and the third switch device further comprises a first switch unit and a second switch unit;
the combining port of the power dividing/combining component is connected to the first shunt port of the power dividing/combining component through the fifth transmission line and the sixth transmission line;
the combining port of the power dividing/combining component is further connected to the second shunt port of the power dividing/combining component through the seventh transmission line and the eighth transmission line;
the junction of the fifth transmission line and the sixth transmission line is connected to the junction of the seventh transmission line and the eighth transmission line;
an end of the matching resistance is connected to ground through the first switch unit, and the other end of the matching resistance is connected to ground through the second switch unit.

24. The hot standby system of claim 22, wherein
when the primary RF power amplifier functions properly,
a signal inputted from the combining port of the first SPDT microwave switch is transmitted through the first shunt port of the first SPDT microwave switch to the input port of the primary RF power amplifier; after amplified by the primary RF power amplifier, the signal is transmitted to the first shunt port of the second SPDT microwave switch and then to the combining port of the second SPDT microwave switch;
when the primary RF power amplifier fails,
a signal inputted from the combining port of the first SPDT microwave switch is transmitted through the second shunt port of the first SPDT microwave switch to the input port of the auxiliary RF power amplifier; after amplified by the auxiliary RF power amplifier, the signal is transmitted to the second shunt port of the second SPDT microwave switch and then to the combining port of the second SPDT microwave switch.

25. A hot standby method for radio frequency (RF) power amplifier, comprising:
when a primary RF power amplifier function properly,
setting the status of the switch devices of the SPDT microwave switches installed at the input and output sides of the primary RF power amplifier to transmit a signal inputted from the combining port of the SPDT microwave switch installed at he input side of the primary RF power amplifier through the first shunt port of the SPDT microwave switch installed at the input side of the primary RF power amplifier to the input port of the primary RF power amplifier; amplify the signal by the primary RF power amplifier, and transmit the amplified signal to the first shunt port of the SPDT microwave switch installed at the output side of the primary RF power amplifier and then to the combining port of the SPDT microwave switch installed at the output side of the primary RF power amplifier for export;
when one primary RF power amplifier fails,
setting the status of the switch devices of the SPDT microwave switches installed at the input and output sides of the one primary RF power amplifier to transmit a signal inputted from the combining port of the SPDT microwave switch installed at the input side of the one primary RF power amplifier through the second shunt port of the SPDT microwave switch installed at the input side of the one primary RF power amplifier to the input port of the auxiliary RF power amplifier;
amplify the signal by the auxiliary RF power amplifier, and transmit the amplified signal to the second shunt port of the SPDT microwave switch installed at the output side of the one primary RF power amplifier and then to the combining port of the SPDT microwave switch installed at the output side of the one primary RF power amplifier for export;
wherein the SPDT microwave switches each comprises eight transmission lines: a first, a second, a third, a fourth, a fifth, a sixth, a seventh and an eighth transmission line; and four switch devices: a first, a second, a third and a fourth switch device;
when a primary RF power amplifier function properly,
setting the first, the third and the fourth switch devices of the SPDT microwave switches installed at the input and output sides of the primary RF power amplifier to be closed, setting the second switch devices of the first and the second SPDT microwave switches installed at the input and output sides of the primary RF power amplifier to be open;
transmitting the signal inputted from the combining port to the first shunt port of the SPDT microwave switch installed at the input side of the primary RF power amplifier through the second and the fifth transmission lines of the SPDT microwave switch installed at the input side of the primary RF power amplifier, transmitting the signal to the primary RF power amplifier which amplifies the signal; transmitting the amplified signal to the first shunt port of the SPDT microwave switch installed at the output side of the primary RF power amplifier, transmitting the amplified signal through the fifth and the second transmission lines of the SPDT microwave switch installed at the output side of the primary RF power amplifier to the combining port of the SPDT microwave switch installed at the output side of the primary RF power amplifier;
when one primary RF power amplifier and the auxiliary RF power amplifier operate in parallel,
setting the first and the second switch devices of the SPDT microwave switches installed at the input and output sides of the one primary RF power amplifier to be closed, setting the third and the fourth switch devices of the SPDT microwave switches installed at the input and output sides of the one primary RF power amplifier to be open;
dividing the signal inputted from the combining port of the SPDT microwave switch installed at the input side of the one primary RF power amplifier into a first signal and a second signal, transmitting the first signal through the eighth transmission line and the seventh transmission line of the SPDT microwave switch installed at the input side of the one primary RF power amplifier to the first shunt port of the SPDT microwave switch installed at the input side of the one primary RF power amplifier to be transmitted to the primary RF power amplifiers; transmitting the second signal through the fourth transmission line and the sixth transmission line to the second shunt port of the SPDT microwave switch installed at the input side of the one primary RF power amplifier to be transmitted to the auxiliary RF power amplifier;
amplifying the first signal and the second signal by the primary RF power amplifier and the auxiliary RF power amplifier respectively, and transmitting the first signal and the second signal respectively to the first and the second shunt ports of the SPDT microwave switch installed at the output side of the one primary RF power amplifier;

transmitting the amplified first signal through the seventh transmission line and the eighth transmission line of the SPDT microwave switch installed at the output side of the one primary RF power amplifier, transmitting the amplified second signal through the sixth transmission line and the fourth transmission line of the SPDT microwave switch installed at the output side of the one primary RF power amplifier, and combining the amplified first signal and the amplified second signal into one signal and transmitting the combined signal to the combining port of the SPDT microwave switch installed at the output side of the one primary RF power amplifier for export; and when one primary RF power amplifier fails, setting the second, the third and the fourth switch devices of the SPDT microwave switches installed at the input and output sides of the one primary RF power amplifier to be closed, setting the first switch devices of the SPDT microwave switches installed at the input and output sides of the one primary RF power amplifier to be open; transmitting the signal inputted from the combining port to the second shunt port of the SPDT microwave switch installed at the input side of the one primary RF power amplifier through the first and the third transmission lines of the SPDT microwave switch installed at the input side of the one primary RF power amplifier, transmitting the signal to the auxiliary RF power amplifier which amplifies the signal; transmitting the amplified signal to the second shunt port of the SPDT microwave switch installed at the output side of the one primary RF power amplifier, transmitting the amplified signal through the third and the first transmission lines of the SPDT microwave switch installed at the output side of the one primary RF power amplifier to the combining port of the SPDT microwave switch installed at the output side of the one primary RF power amplifier for export.

* * * * *